(12) United States Patent
Shiode

(10) Patent No.: US 12,399,425 B2
(45) Date of Patent: Aug. 26, 2025

(54) MOLDING APPARATUS AND ARTICLE MANUFACTURING METHOD

(71) Applicant: CANON KABUSHIKI KAISHA, Tokyo (JP)

(72) Inventor: Yoshihiro Shiode, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 102 days.

(21) Appl. No.: 18/162,567

(22) Filed: Jan. 31, 2023

(65) Prior Publication Data

US 2023/0173742 A1 Jun. 8, 2023

Related U.S. Application Data

(63) Continuation of application No. PCT/JP2021/026191, filed on Jul. 12, 2021.

(30) Foreign Application Priority Data

Sep. 8, 2020 (JP) ................................. 2020-150738

(51) Int. Cl.
*G03F 7/00* (2006.01)
*B29C 59/02* (2006.01)
(Continued)

(52) U.S. Cl.
CPC .......... *G03F 7/0002* (2013.01); *B29C 59/022* (2013.01); *B29C 59/026* (2013.01);
(Continued)

(58) Field of Classification Search
CPC ........... G03F 7/0002; B29C 2043/3233; B29C 2043/5808
See application file for complete search history.

(56) References Cited

U.S. PATENT DOCUMENTS 7,592,108 B2 * 9/2009 Yamaguchi ........... G03F 7/7035
430/22
8,394,282 B2 3/2013 Panga et al.
(Continued)

FOREIGN PATENT DOCUMENTS

CN 106054518 A 10/2016
CN 110361929 A 10/2019
(Continued)

OTHER PUBLICATIONS

International Search Report issued in International Appln. No. PCT/JP2021/026191 mailed Sep. 21, 2021. English translation provided.
(Continued)

*Primary Examiner* — Atul P. Khare
(74) *Attorney, Agent, or Firm* — ROSSI, KIMMS & McDOWELL LLP

(57) ABSTRACT

There is provided a molding apparatus that molds a composition on a substrate by using a mold, characterized by including a control unit configured to control a process of forming a film of the composition between a first surface of the mold and the substrate by bringing the first surface into contact with the composition, and a deforming unit configured to deform the first surface into a convex shape with respect to a substrate side by applying power to a second surface of the mold on an opposite side to the first surface, wherein the control unit controls the deforming unit in the process so as to make power applied to the second surface by the deforming unit after contact between the first surface and the composition larger than power applied to the second surface by the deforming unit before the contact between the first surface and the composition.

10 Claims, 17 Drawing Sheets

(51) Int. Cl.
  *B29C 37/00* (2006.01)
  *B29C 43/32* (2006.01)
  *B29C 43/58* (2006.01)

(52) U.S. Cl.
  CPC .......... *G03F 7/70* (2013.01); *B29C 2037/903* (2013.01); *B29C 2043/3233* (2013.01); *B29C 2043/5808* (2013.01)

(56) References Cited

U.S. PATENT DOCUMENTS

| | | | |
|---|---|---|---|
| 8,678,808 B2* | 3/2014 | Yoshida | B82Y 10/00 |
| | | | 264/494 |
| 8,945,444 B2* | 2/2015 | Lu | B29C 43/003 |
| | | | 264/40.5 |
| 9,415,418 B2 | 8/2016 | Sreenivasan et al. | |
| 9,718,096 B2 | 8/2017 | Sreenivasan et al. | |
| 9,798,231 B2* | 10/2017 | Shiode | G11B 5/855 |
| 9,921,469 B2 | 3/2018 | Sato | |
| 10,828,808 B2* | 11/2020 | Shiode | G03F 7/0002 |
| 2006/0172553 A1 | 8/2006 | Choi et al. | |
| 2010/0244326 A1 | 9/2010 | Tokue et al. | |
| 2010/0291257 A1* | 11/2010 | Resnick | B82Y 40/00 |
| | | | 977/902 |
| 2016/0297136 A1 | 10/2016 | Wakabayashi | |
| 2019/0317397 A1 | 10/2019 | Sato | |
| 2019/0366620 A1 | 12/2019 | Kusaka | |

FOREIGN PATENT DOCUMENTS

| | | | | |
|---|---|---|---|---|
| CN | 110554564 A | 12/2019 | | |
| CN | 210940062 U | 7/2020 | | |
| JP | 2009517882 A | 4/2009 | | |
| JP | 2009518207 A | 5/2009 | | |
| JP | 2009536591 A | 10/2009 | | |
| JP | 4391420 B2 | 12/2009 | | |
| JP | 2010221374 A | 10/2010 | | |
| JP | 5139421 B2 | 2/2013 | | |
| JP | 2014069339 A | 4/2014 | | |
| JP | 2016039182 A | * | 3/2016 | .......... H01L 21/30 |
| JP | 2018163964 A | 10/2018 | | |
| JP | 2019186404 A | 10/2019 | | |
| JP | 2020009899 A | 1/2020 | | |
| KR | 1020090020922 A | 2/2009 | | |
| KR | 1020130123760 A | 11/2013 | | |
| KR | 1020200051493 A | 5/2020 | | |
| TW | 201441061 A | 11/2014 | | |
| WO | 2004044651 A1 | 5/2004 | | |
| WO | 2007064386 A1 | 6/2007 | | |
| WO | 2007067469 A2 | 6/2007 | | |
| WO | 2007132320 A2 | 11/2007 | | |

OTHER PUBLICATIONS

Written Opinion issued in International Appln. No. PCT/JP2021/026191 mailed Sep. 21, 2021.
Office Action issued in Chinese Application No. 202180054771.7 mailed Aug. 30, 2024. English translation provided.

* cited by examiner

FIG. 5
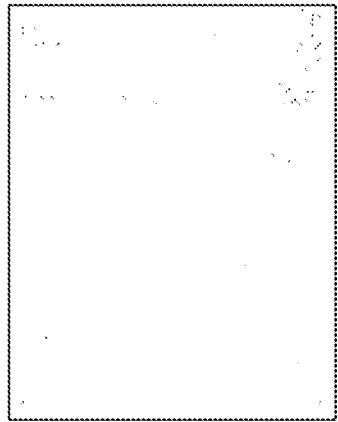
5a
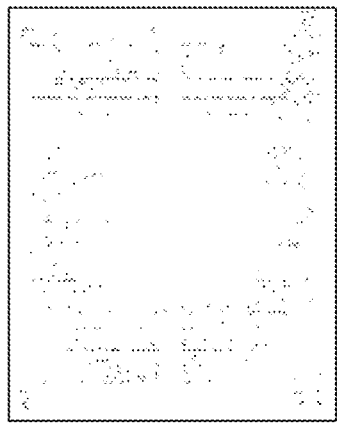
5b
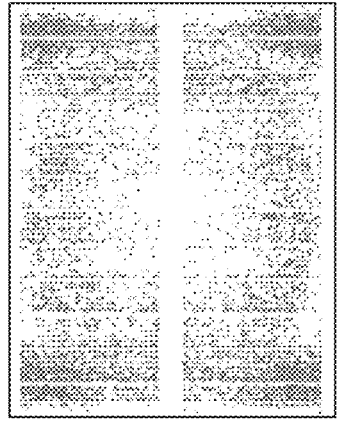
5c

F I G. 18
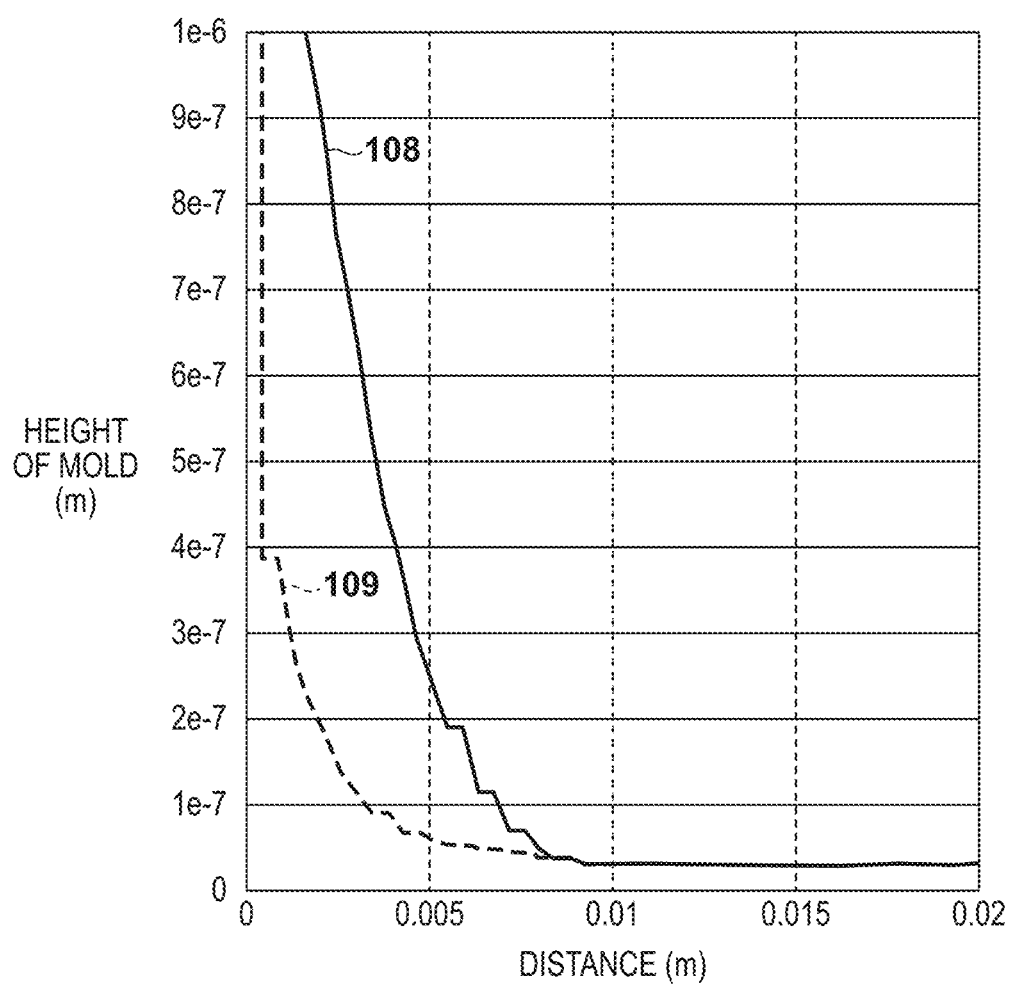

MOLDING APPARATUS AND ARTICLE MANUFACTURING METHOD

CROSS-REFERENCE TO RELATED APPLICATIONS

This application is a Continuation of International Patent Application No. PCT/JP2021/026191, filed Jul. 12, 2021, which claims the benefit of Japanese Patent Application No. 2020-150738, filed Sep. 8, 2020, both of which are hereby incorporated by reference herein in their entirety.

BACKGROUND OF THE INVENTION

Field of the Invention

The present invention relates to a molding apparatus and an article manufacturing method.

Background Art

An imprint technique is a technique that enables the transfer of nano-scale fine patterns (concave-convex patterns), and this technique has attracted attention as one of mass-production lithography techniques for semiconductor devices, magnetic storage media, and the like. The imprint technique is a technique of transferring nano-scale fine patterns (concave-convex patterns) onto substrates such as silicon wafers and glass plates by using molds on which patterns are formed as original plates.

An imprint apparatus using the imprint technique is a molding apparatus that molds an imprint material as a composition on a substrate by using a mold. More specifically, the imprint apparatus forms the pattern of an imprint material on a substrate by curing the imprint material with the imprint material on the substrate being in contact with a mold and separating the cured imprint material from the mold. Curing methods for imprint materials include a photo-curing method and a heat-curing method. The photo-curing method suppresses an increase in the transfer time for patterns based on temperature control or a decrease in the dimension accuracy of patterns due to changes in temperature, and hence is suitable for the manufacture of semiconductor devices and magnetic storage media.

In the imprint apparatus, when an imprint material on a substrate is brought into contact with a mold, air bubbles are sometimes mixed in the imprint material. When the imprint material is cured while air bubbles are mixed in the material in this manner, no pattern is formed in a portion in which air bubbles are present, resulting in a defect (non-filling defect).

Accordingly, there is proposed a technique of deforming (bending) a mold (its pattern surface) in a convex shape with respect to a substrate, when bringing an imprint material on the substrate into contact with the mold, and then restoring the mold to the original shape (planar shape) (see patent literatures 1 to 4). This technique makes it possible to reduce air bubbles mixed in an imprint material on a substrate by pushing out air bubbles present between the substrate (the imprint material on the substrate) and a mold to the outside.

There is also proposed a technique of deforming a mold or deforming a substrate by changing the suction power (suction pressure) for suctioning the substrate when separating the mold from the imprint material cured on the substrate, thereby reducing defects in the pattern formed on the substrate (see patent literatures 5 and 6).

CITATION LIST

Patent Literature

PTL 1: Japanese Patent Laid-Open No. 2009-536591
PTL 2: Japanese Patent Laid-Open No. 2009-518207
PTL 3: Japanese Patent No. 4391420
PTL 4: Japanese Patent No. 5139421
PTL 5: US-2006-0172553
PTL 6: Japanese Patent Laid-Open No. 2009-517882

Recently, imprint apparatuses have been required to further improve the productivity (throughput). Consider, for example, a case in which while a mold is deformed in a convex shape with respect to a substrate, the mold is brought into contact with the imprint material on the substrate so as to spread the imprint material from the center of a shot region toward its periphery. In this case, the time required for a step (dynamic spread step) before transition to the filling step of filling a mold (its concave portion) with an imprint material on a substrate or the filling step is shortened by increasing the speed of spreading the imprint material, thereby improving the productivity. Note, however, that since the time required for the filling step generally depends on the time required for the alignment step of aligning (positioning) a mold and a substrate, it is required to shorten the time required for the dynamic spread step. However, as a result of an intensive study by the present inventor, it has been found out that unnecessarily shortening the time required for the dynamic spread step will increase non-filling defects, which leads to a reduction in productivity.

The present invention provides a molding apparatus advantageous in improving the productivity.

SUMMARY OF THE INVENTION

A molding apparatus as one aspect of the present invention is that a molding apparatus that molds a composition on a substrate by using a mold, characterized by including a control unit configured to control a process of forming a film of the composition between a first surface of the mold and the substrate by bringing the first surface into contact with the composition, and a deforming unit configured to deform the first surface into a convex shape with respect to a substrate side by applying power to a second surface of the mold on an opposite side to the first surface, wherein the control unit controls the deforming unit in the process so as to make power applied to the second surface by the deforming unit after contact between the first surface and the composition larger than power applied to the second surface by the deforming unit before the contact between the first surface and the composition.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain principles of the invention.

FIG. 5 is a view showing the experimental results obtained by observing how non-filling defects occur.

FIG. 18 is a graph showing the results of evaluating the curvature of a mold by using the basic control profile shown in FIG. 14.

DESCRIPTION OF THE EMBODIMENTS

Figure 1:
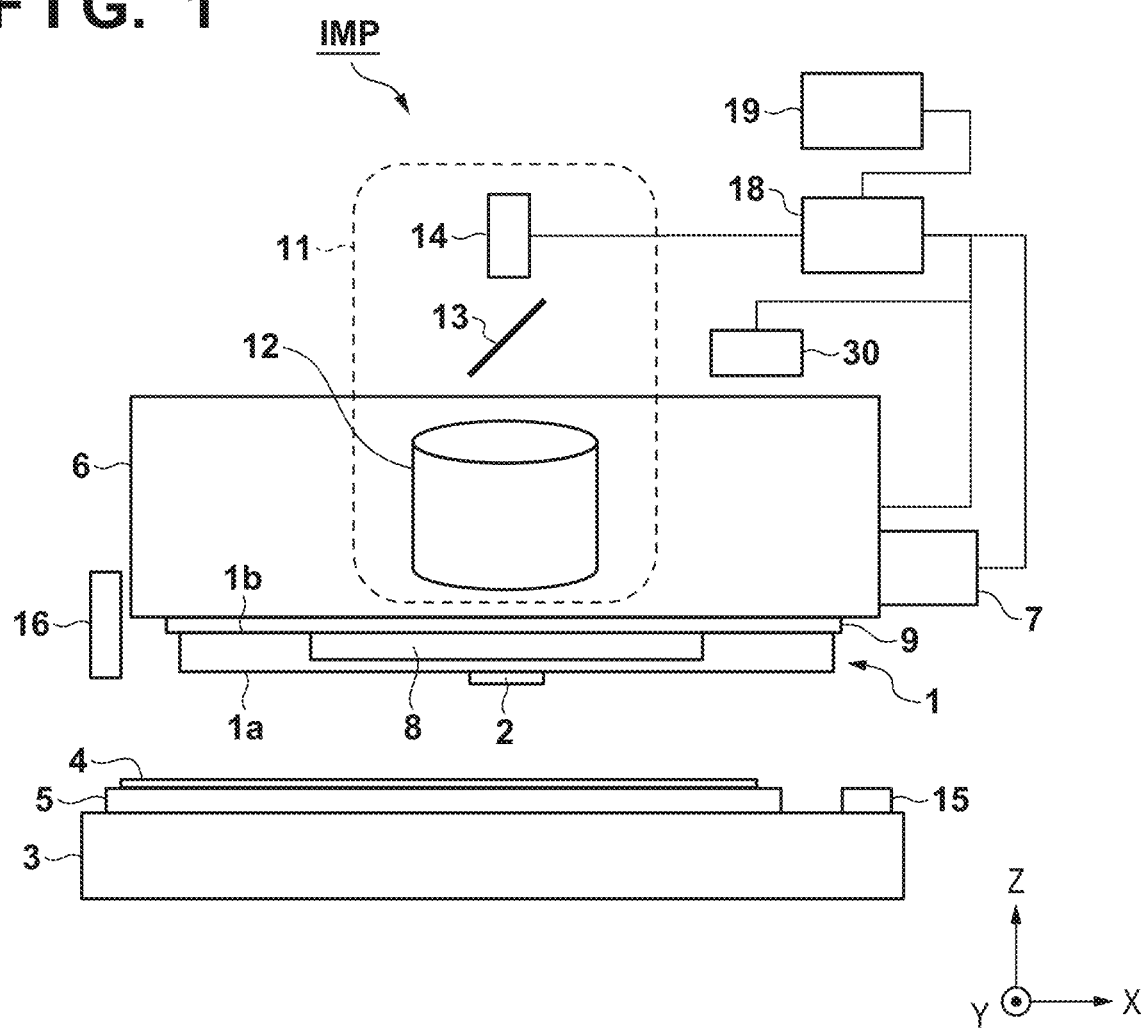
FIG. 1 is a schematic view showing the arrangement of an imprint apparatus according to one aspect of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 is a schematic view showing the arrangement of an imprint apparatus IMP as one aspect of the present invention. The imprint apparatus IMP is a lithography apparatus that is used in a lithography step as a manufacturing step for semiconductor devices, magnetic storage media, liquid crystal display elements, and the like and forms patterns on substrates. The imprint apparatus IMP functions as a molding apparatus that performs the molding process of molding an imprint material as a composition on a substrate by using a mold. In this embodiment, the imprint apparatus IMP brings the imprint material supplied onto a substrate into contact with a mold and supplies curing energy to the imprint material, thereby forming the pattern of the cured material onto which the pattern of the mold is transferred. Note that a mold is also called a template or original plate.

As the imprint material, a material (curable composition) to be cured by receiving curing energy is used. An example of the curing energy that is used is electromagnetic waves, heat, or the like. As the electromagnetic waves, for example, infrared light, visible light, ultraviolet light, and the like selected from the wavelength range of 10 nm (inclusive) to 1 mm (inclusive) is used.

The curable composition is a composition cured by light irradiation or heating. The photo-curable composition cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like.

The imprint material may be applied in a film shape onto the substrate by a spin coater or a slit coater. The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used, and a member made of a material different from that of the substrate may be formed on the surface of the substrate, as needed. More specifically, examples of the substrate include a silicon wafer, a semiconductor compound wafer, silica glass, and the like.

The imprint apparatus IMP includes, as shown in FIG. 1, a substrate stage 3, a substrate chuck 5, a imprint head 6, a pressure adjusting unit 7 and a mold chuck 9. Furthermore, the imprint apparatus IMP includes a relay optical system 12, a bandpass filter 13, an observation unit 14, a first measuring unit 15, a second measuring unit 16, a control unit 18, a storage unit 19 and an irradiation system 30.

In the specification and the accompanying drawings, directions will be indicated on an XYZ coordinate system in which directions parallel to the surface of the substrate 4 are defined as the X-Y plane. Directions parallel to the X-axis, the Y-axis, and the Z-axis of the XYZ coordinate system are the X direction, the Y direction, and the Z direction, respectively, and a rotation about the X-axis, a rotation about the Y-axis, and a rotation about the Z-axis are θX, θY, and θZ, respectively. Control or driving (moving) concerning the X-axis, the Y-axis, and the Z-axis means control or driving concerning a direction parallel to the X-axis, a direction parallel to the Y-axis, and a direction parallel to the Z-axis, respectively. In addition, control or driving (moving) concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively.

A mold 1 has a rectangular outer shape and is formed from a quartz substrate. The mold 1 has a mesa region 2 in a central portion of a first surface 1a on the substrate side on which a pattern (concave-convex pattern) to be transferred on a substrate 4 is formed. The mesa region 2 is formed to be higher than its surrounding region, that is, to have a stepped structure, in order to prevent regions other than the mesa region 2 from coming into contact with the substrate 4 when forming an imprint material on the substrate. The mold 1 has a core out 8 (recess structure), which is a cylindrical recess portion, in a second surface 1b on the opposite side to a first surface 1a including the mesa region 2. The core out 8 is also called a cavity and is generally formed such that the center of the core out 8 overlaps the center of the mesa region 2.

Figure 2:
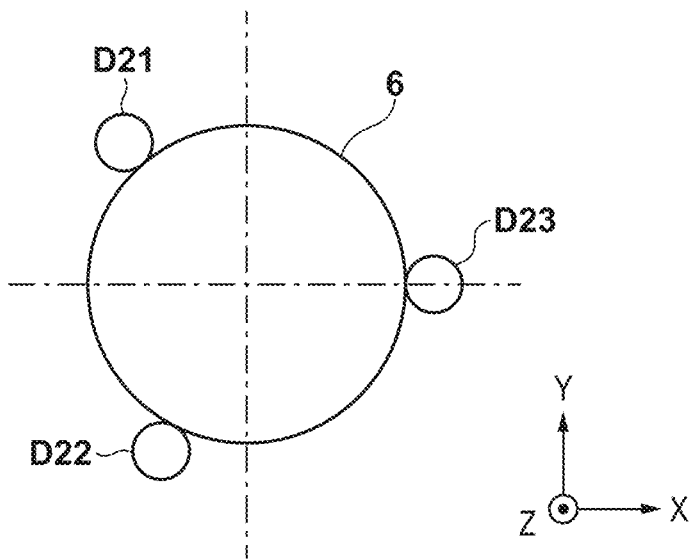
FIG. 2 is a view showing an example of the arrangement of a driving unit for an imprint head.

The imprint head 6 holds, for example, the mold 1 through the mold chuck 9 that vacuum-chucks or electrostatically chucks the mold 1. The imprint head 6 functions as a pressing portion that brings the mold 1 chucked to the mold chuck 9 into contact with the imprint material on a substrate and presses the mold 1 against the imprint material. The imprint head 6 includes a driving unit that drives (moves) the mold chuck 9. As shown in FIG. 2, the driving unit includes three-axis driving systems D21, D22, and D23. FIG. 2 is a view showing an example of the arrangement of the driving unit for the imprint head 6. The driving systems D21, D22, and D23 are formed from, for example, actuators that can be independently driven in the Z direction. The position and posture (state) of the imprint head 6 can be measured (observed) in real time by various types of sensors provided for the imprint apparatus IMP, for example, a height sensor and a power sensor (not shown) incorporated in the imprint head 6.

The pressure adjusting unit 7 adjusts the pressure of the core out 8 provided in the mold 1. The core out 8 is provided for the purpose of gradually expanding a region in contact with an imprint material from the central portion of the mesa region 2 by deforming the mold 1, more specifically, the mesa region 2 in a convex shape with respect to the substrate side when bringing the mold 1 into contact with the imprint material on the substrate. More specifically, the mesa region 2 of the mold 1 can be deformed in a convex shape with respect to the substrate side by making the pressure adjusting unit 7 increase the pressure of the core out 8 more than the outside pressure. In this manner, the pressure adjusting unit 7 functions as a deforming unit that deforms the first surface 1a in a convex shape with respect to the substrate side by applying power to the second surface 1b of the mold 1 on the opposite side to the first surface 1a. In this embodiment, the pressure adjusting unit 7 deforms the mesa region 2 (first surface 1a) in a convex shape with respect to the substrate side by adjusting the pressure of the core out 8 of the mold 1 so as to apply power to the core out 8 (second surface 1b). Air bubbles mixed in an imprint material on a substrate can be reduced by deforming the mesa region 2 of the mold 1 in a convex shape with respect to the substrate side so as to push out a gas present between the mold 1 (mesa region 2) and the substrate 4 (imprint material) to the outside (outer periphery).

In this embodiment, the relay optical system 12 is placed inside the imprint head 6, and the bandpass filter 13 and the irradiation system 30 are placed above the imprint head 6. While an imprint material on a substrate is in contact with the mold 1, the irradiation system 30 cures the imprint material by irradiating the imprint material on the substrate with light (for example, ultraviolet light) through the bandpass filter 13 and the relay optical system 12.

The observation unit 14 is placed above the imprint head 6. The observation unit 14 observes the mesa region 2 of the mold 1 and a shot region of the substrate 4 through the bandpass filter 13 and the relay optical system 12. More specifically, the observation unit 14 observes a state in which an imprint material on a substrate is spread by the mold 1 or the interference fringes formed by the narrow gap between the mold 1 and the substrate 4 and obtains observation images. The observation unit 14 also functions as an obtaining unit that obtains information concerning an increase in contact area (contact region) between the mold 1 (mesa region 2) and an imprint material on a substrate.

The substrate stage 3 holds the substrate 4 through the substrate chuck 5 that vacuum-chucks or electrostatically chucks the substrate 4. The substrate stage 3 drives (moves) the substrate chuck 5 in the X and Y directions to enable an imprint process for the entire surface (all the shot regions) of the substrate 4.

The substrate stage 3 is provided with the first measuring unit 15 that measures the height of the first surface 1a of the mold 1 on the substrate side, for example, the height of the mesa region 2. Accordingly, moving the substrate stage 3 so as to make the first measuring unit 15 pass under the mold 1 allows the first measuring unit 15 to measure the shape (surface shape) or tilt amount of the mesa region 2 of the mold 1.

The imprint apparatus IMP is also provided with the second measuring unit 16 that faces the substrate stage 3 and measures the height of the substrate 4. Accordingly, moving the substrate stage 3 so as to make the substrate 4 pass under the second measuring unit 16 allows the measuring unit 16 to measure the shape (surface shape) or tilt amount of the substrate 4.

The control unit 18 is formed from an information processing apparatus (computer) including a CPU and a memory and controls the whole imprint apparatus IMP in accordance with the programs stored in the storage unit 19. The control unit 18 controls the respective units of the imprint apparatus IMP to control the process of forming an imprint material film between the mesa region 2 and the substrate 4 by bringing the mesa region 2 (first surface 1a) of the mold 1 into contact with the imprint material (composition) on the substrate. In this embodiment, the process of forming an imprint material film is the imprint process of forming a pattern of the imprint material on each of the plurality of shot regions on the substrate. The control unit 18 can evaluate the imprint process by analyzing the image obtained by the observation unit 14 and reflect the evaluation result in the imprint process. For example, the control unit 18 obtains the measurement result (the surface shape and tilt amount of the mesa region 2 of the mold 1 and the surface shape and tilt amount of the substrate 4) obtained by the first measuring unit 15 and the second measuring unit 16 and checks the leveling state between the mold 1 and the substrate 4. The control unit 18 controls the state (position and posture) of the imprint head 6 and the state (shape) of the mold 1 through the imprint head 6 and the pressure adjusting unit 7 based on the leveling state between the mold 1 and the substrate 4.

Figure 4:
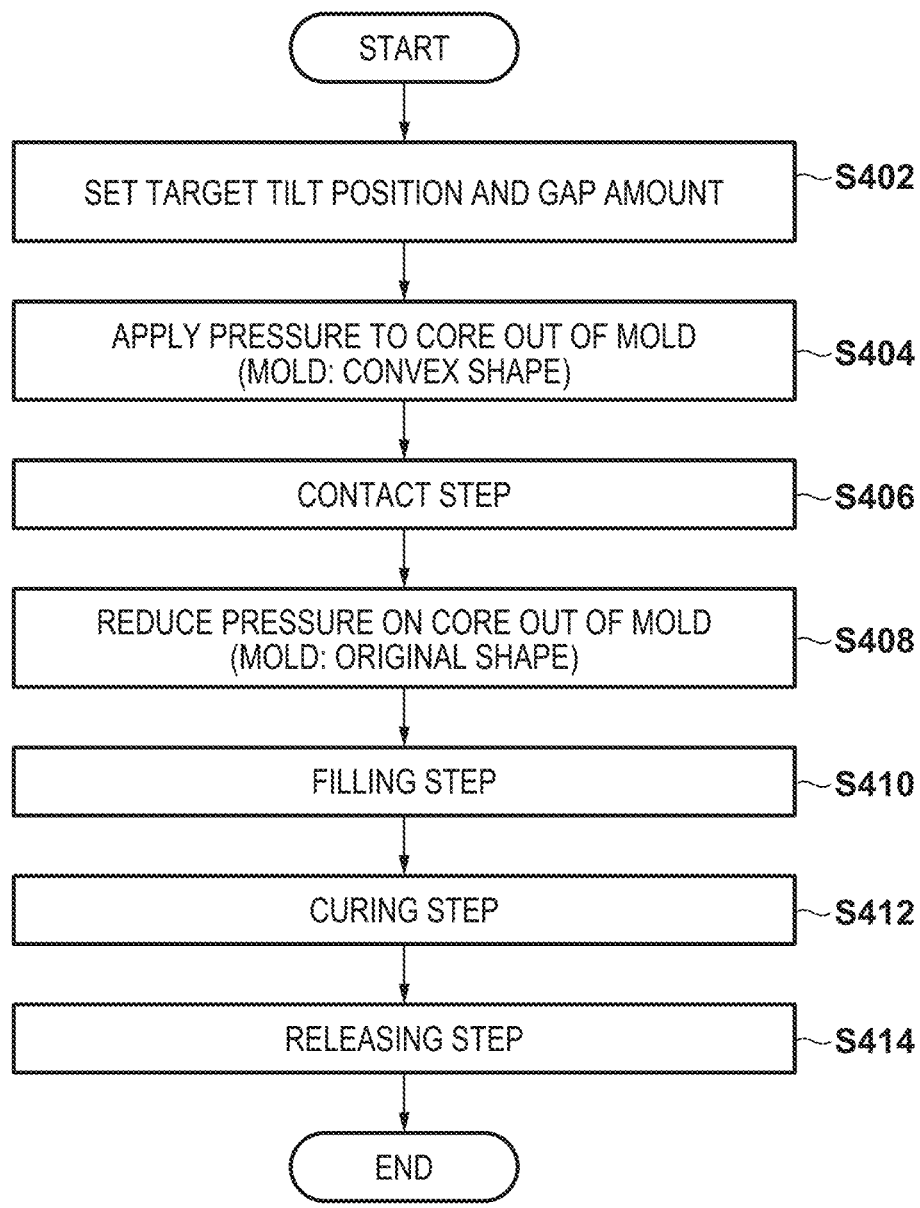
FIG. 4 is a flowchart for explaining a general imprint process.

A general imprint process will be described in detail with reference to FIG. 4. FIG. 4 is a flowchart for explaining a general imprint process. An imprint process is generally performed while the leveling state between the mold 1 and the substrate 4 is maintained parallel. More specifically, making the leveling between the mesa region 2 of the mold 1 and the shot regions of the substrate 4 parallel will implement an ideal imprint process. Accordingly, the first measuring unit 15 (on the apparatus) measures the surface shape (high-direction (Z-direction) position) and tilt amount of the mesa region 2 of the mold 1 in advance, and the second measuring unit 16 globally measures the surface shape and tilt amount of the substrate 4 in advance, thereby obtaining the leveling state between the mesa region 2 and the mold 1. In step S402, a tilt position (target tilt position) as a target for the mold 1 or the substrate 4 is set, and a gap amount between the mesa region 2 of the mold 1 and the substrate 4 is also set.

Figure 3:
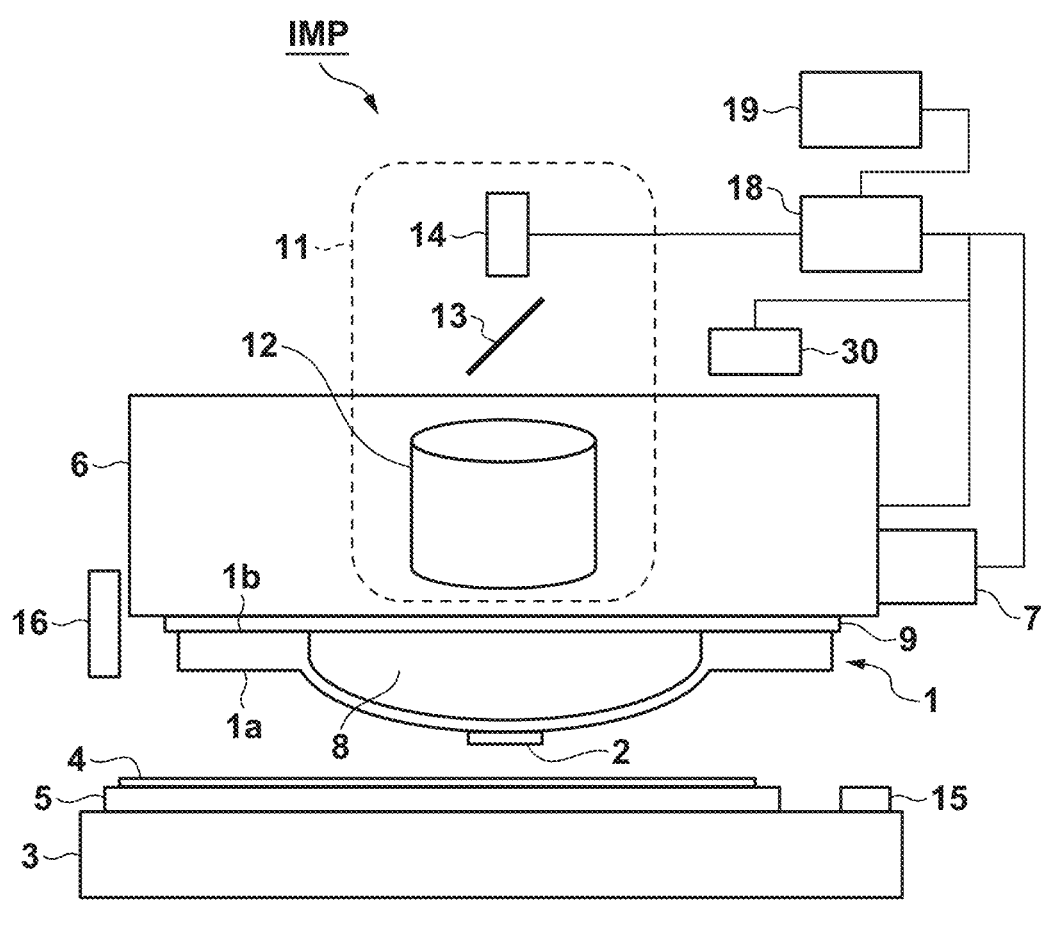
FIG. 3 is a view showing a state in which the mesa region of a mold is deformed in a convex shape with respect to the substrate side.

In step S404, as shown in FIG. 3, the mesa region 2 of the mold 1 is bulged toward the substrate side and deformed in a convex shape by adding (applying) a pressure to the core out 8 of the mold 1 through the pressure adjusting unit 7. As described above, this operation is performed to suppress air bubbles from being confined in the imprint material on the substrate when starting to bring the mold 1 into contact with the imprint material on the substrate. Note that the deformation amount of the mesa region 2 of the mold 1, that is, the value of a pressure added from the pressure adjusting unit 7 to the core out 8 of the mold 1, is set in advance. FIG. 3 is a view showing a state in which the mesa region 2 of the mold 1 is deformed in a convex shape with respect to the substrate state in the imprint apparatus IMP.

In step S406, the contact step of bringing the mold 1 into contact with the imprint material on the substrate is started. More specifically, the imprint head 6 lowers the mold chuck 9 chucking the mold 1 in the Z direction with respect to the substrate 4 positioned in the X and Y directions by the substrate stage 3, thereby bringing the central portion of the mesa region 2 of the mold 1 into contact with the imprint material on the substrate. In addition, while this state is maintained, power control is performed to lower the mold chuck 9 in the Z direction until a predetermined power is set to spread the imprint material on the substrate up to the entire mesa region 2 of the mold 1. At this time, height (Z-direction position) control, tilt control, and power control for the mold 1 are implemented by controlling the driving of each of the driving systems D21, D22, and D23 constituting the driving unit for the imprint head 6.

When the imprint material on the substrate is spread to the entire mesa region 2 of the mold 1, the pressure of the core out 8 of the mold 1 is lowered (decreased) through the pressure adjusting unit 7 to restore the shape of the mesa region 2 of the mold 1 to the original shape in step S408. In step S408, the leveling state between the mold 1 and the substrate 4 is made parallel finally. In step S410, the process shifts to the filling step of filling the mold 1 with the imprint material on the substrate, and the leveling state between the mold 1 and the substrate 4 is maintained parallel for a predetermined period (until the mold 1 is filled with the imprint material on the substrate). Note that the step before transition to the filling step, more specifically, the step including step S406 and step S408, is also called a dynamic spread step.

In step S412, when the mold 1 is filled with the imprint material on the substrate, the irradiation system 30 cures the imprint material by irradiating the imprint material with light (curing step). Subsequently, in step S414, the imprint head 6 raises the mold chuck 9 in the Z direction to separate the mold 1 from the cured imprint material on the substrate (releasing step).

Although the general sequence of the imprint process has been described above with reference to FIG. 4, a similar sequence can be performed for the purpose of apparatus calibration even in the absence of an imprint material on a substrate. In addition, pressure control (control to deform the mold 1 in a convex shape with respect to the substrate side), height (Z-direction position) control, tilt control, and power control are stored in advance as control profiles in the storage unit 19 and executed by the control unit 18.

In an imprint process, in order to achieve a further improvement in productivity (throughput), it is required to shorten the time required for the dynamic spread step. FIGS. 5a, 5b, and 5c show the experimental results obtained by observing how non-filling defects occur as the time required for the dynamic spread step is changed. FIGS. 5a, 5b, and 5c respectively show the experimental results obtained when the time required for the dynamic spread step is set to 0.6 sec, 0.5 sec, and 0.4 sec. Note, however, that the time until the end of the filling step (the sum of the time required for the dynamic spread step and the time required for the filling step) is 0.8 sec, which is the same condition throughout the experiments. In this case, referring to FIGS. 5a, 5b, and 5c, as the time required for the dynamic spread step shortens, non-filling defects tend to occur, resulting in an increase in (the number of) non-filling defects. Accordingly, if the time required for the dynamic spread step unnecessarily shortens, non-filling defects increase to result in a reduction in productivity.

Figure 6:
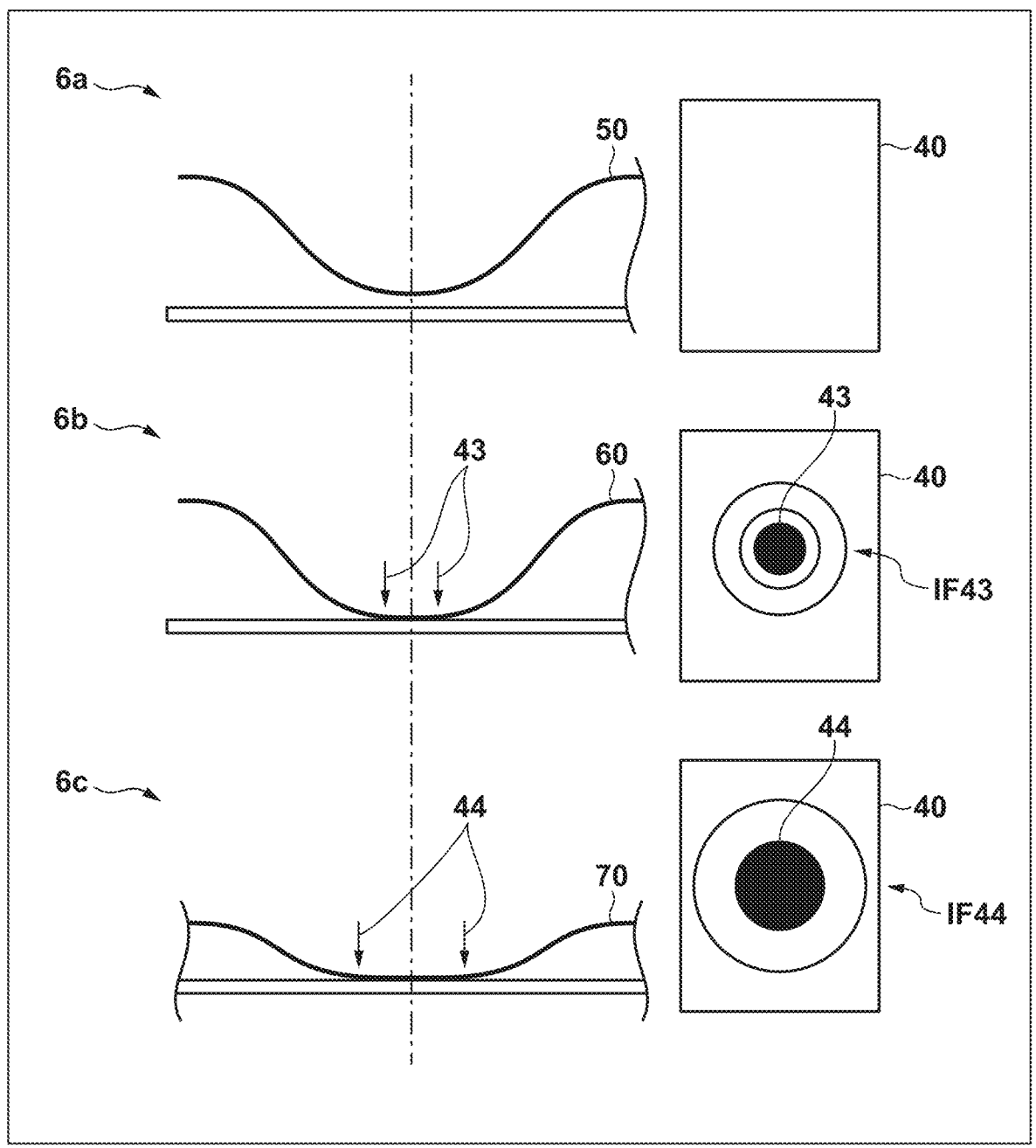
FIG. 6 is a view showing the contact states between an imprint material on a substrate and a mold and the images obtained by an observation unit.

Consider the experimental results obtained by changing the time required for the dynamic spread step. FIGS. 6a, 6b, and 6c respectively show the contact states between the imprint material on the substrate and the mold 1 (mesa region 2) and images 40 obtained by the observation unit 14 in accordance with the contact states and respectively show the contact states different from each other. FIGS. 6a, 6b, and 6c respectively show curved surfaces 50, 60, and 70 showing the contact states different from each other and the shapes (deformation amounts) of the mold 1.

FIG. 6a shows a state in which the imprint material on the substrate is not in contact with the mold 1. In this state, the image 40 obtained by the observation unit 14 includes no interference pattern.

FIG. 6b shows a state in which the imprint material on the substrate is in contact with the mold 1 with the contact radius (distance) defined by a contact boundary 43, and the image 40 obtained by the observation unit 14 in this state includes an interference pattern IF43. The interference pattern IF43 indicates that since the intervals between interference fringes near the contact boundary 43 are small, the tilt of the convex shape of the mold 1 (the curvature of the curved surface 60) near the contact boundary 43 is large.

FIG. 6c shows a state in which the imprint material on the substrate is in contact with the mold 1 with a contact radius (distance) defined by a contact boundary 44, and the image 40 obtained by the observation unit 14 in this state includes an interference pattern IF44. More specifically, FIG. 6c shows a state in which while a pressure added to the core out 8 of the mold 1 is maintained constant, the mold 1 is kept pushed into the imprint material on the substrate to make the contact boundary 43 become the contact boundary 44. The interference pattern IF44 indicates that since the interval between interference fringes near the contact boundary 44 is large, the tilt of the convex shape of the mold 1 (the curvature of the curved surface 70) further decreases as compared with the tilt of the convex shape of the mold 1 (the curvature of the curved surface 60) shown in FIG. 6*b*.

Figure 7:
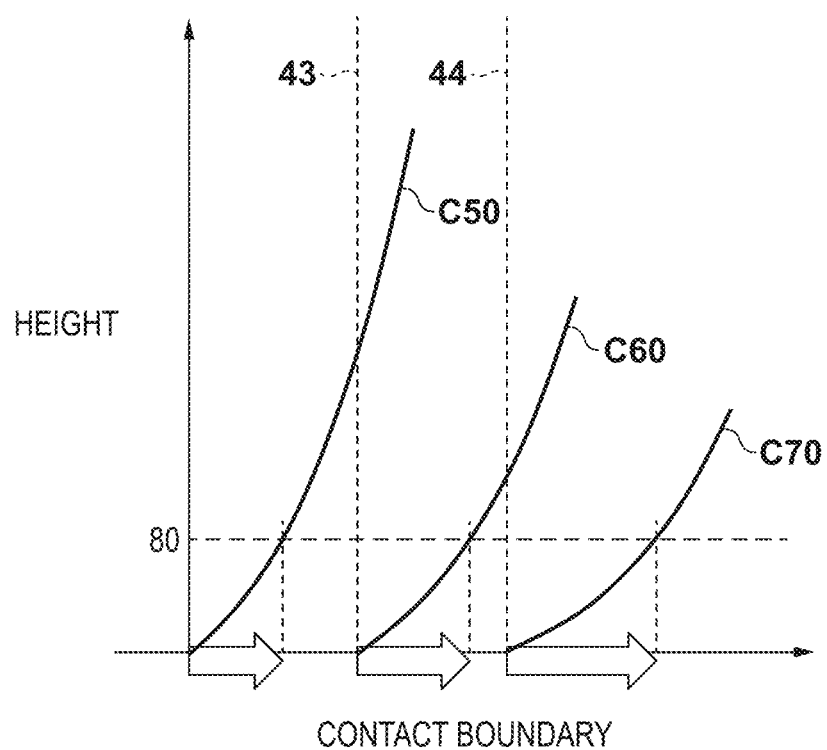
FIG. 7 is a graph for explaining each state shown in FIG. 6 in detail.

The respective states shown in FIGS. 6*a*, 6*b*, and 6*c* will be described in detail with reference to FIGS. 7 and 8. Referring to FIG. 7, a curve C50 indicates the shape (curved surface 50) of the mold 1 in the state (FIG. 6*a*) in which the imprint material on the substrate is not in contact with the mold 1. A curve C60 indicates the shape (curved surface 60) of the mold 1 in the state (FIG. 6*b*) in which the imprint material on the substrate is in contact with the mold 1 with the contact radius defined by the contact boundary 43. Likewise, a curve C70 indicates the shape (curved surface 70) of the mold 1 in the state (FIG. 6*c*) in which the imprint material on the substrate is in contact with the mold 1 with the contact radius defined by the contact boundary 44.

The observation of the interference patterns shown in FIGS. 6*a*, 6*b*, and 6*c* indicates that the interval between interference fringes near the contact boundary increases with an increase in the contact area between the imprint material on the substrate and the mold 1. Referring to FIG. 7, when the height of the half-pitch of an interference fringe is indicated by a broken line 80, an increase in the interval between the interference fringes means an increase in contact boundary. In other words, as the interval between interference fringes increases, the tilts of the convex shapes of the mold 1 (the curvatures of the curved surfaces 50, 60, and 70) decrease, as shown in FIG. 8.

Figure 8:
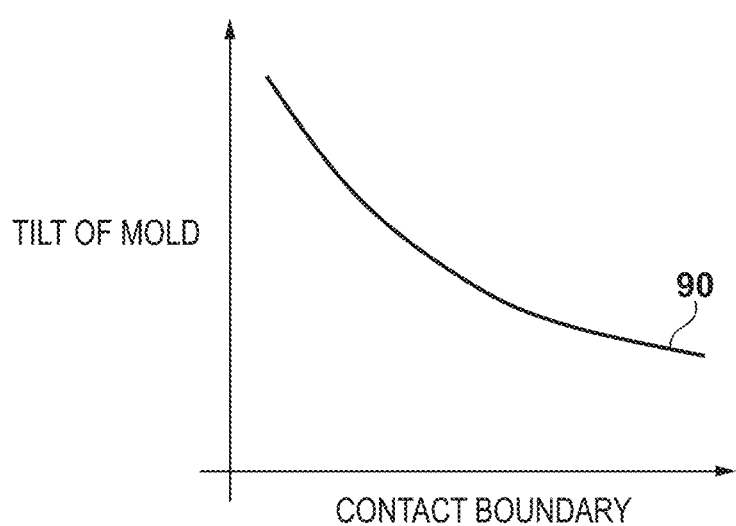
FIG. 8 is a graph for explaining each state shown in FIG. 6 in detail.

Referring to FIG. 8, the tilt of the convex shape of the mold 1 at the contact boundary decreases at a surrounding portion of a shot region with a large contact radius. Accordingly, at the surrounding portion of the shot region, the relative tilt (curvature) between the mold 1 and the substrate 4 at the contact boundary decreases. This means that the effect of reducing air bubbles mixed in the imprint material on the substrate by deforming the mold 1 into a convex shape so as to push out air bubbles present between the mold 1 and the substrate 4 to the outside faster than the spreading of the imprint material decreases at the surrounding portion of the shot region.

Referring back to the experimental results described above, it can be understood from the non-filling defect distribution shown in FIG. 5*c* that the relative tilt between the mold 1 and the substrate 4 at the contact boundary decreases especially at the surrounding portion of the mesa region 2 (shot region) regardless of the time required for the dynamic spread step. Note, however, that such a tendency increases as the time required for the dynamic spread step is shortened. The main factor for this may be that increasing the speed of spreading the imprint material on the substrate increases the pressure of a gas present between the mold 1 and the substrate 4 and increases the number of molecules of the gas trapped between the mold 1 and the substrate 4 (the imprint material on the substrate).

In order to solve such a problem, a material having high gas permeability may be stacked on the mold 1 or the substrate 4. However, this increases the cost of the mold 1 or the substrate 4 in addition to an increase in the number of steps due to the step of stacking a material having high gas permeability.

In the imprint apparatus IMP, increasing the tilt of the convex shape of the mold 1 (the curvature of the curved surface) at the contact boundary may suppress an increase in the number of molecules of a trapped gas which is caused by increasing the speed of spreading the imprint material on the substrate. For example, as disclosed in patent literature 4, changing the thickness, dimension (size), shape, or the like of the core out 8 of the mold 1 can change the deformation amount of the mold 1, that is, the tilt of the convex shape of the mold 1 at the contact boundary. However, changing the thickness, dimension, shape, or the like of the core out 8 of the mold 1 accompanies the risk of dropping or breaking the mold 1 and hence requires restudy (re-examination) of design values. Such restudy of design values requires much time and resources and hence hinders an improvement in productivity (throughput) of the imprint apparatus IMP.

Accordingly, in this embodiment, in order to increase the tilt of the convex shape of the mold 1 at the contact boundary, the pressure added to the core out 8 (second surface 1*b*) of the mold 1 is increased to increase the deformation amount of the mold 1 (mesa region 2). However, increasing the deformation amount of the mold 1 will increase the risk of dropping the mold 1 from the mold chuck 9 and breaking the mold 1. Accordingly, the present inventor made the pressure adjusting unit 7 add a certain pressure to the core out 8 of the mold 1 and calculated how much power to cause the mold 1 to drop from the mold chuck 9 is exerted on the mold 1. Table 1 indicates apparatus conditions in such calculation.

TABLE 1

| | |
|---|---|
| Dimension of Mold | 150 mm × 150 mm |
| Diameter of Core Out | 64 mm |
| Thickness of Mold | 6.35 mm |
| Thickness of Core Out | 1.1 mm |
| Dimension of Mesa Region | 33 mm × 33 mm |
| Area of Suction Region of Mold Chuck | 2645 mm$^2$ |
| Area of Core Out | 3632 mm$^2$ |
| Allowable Value of Suction Pressure of Mold Chuck | −50 kpa |

Figure 9:
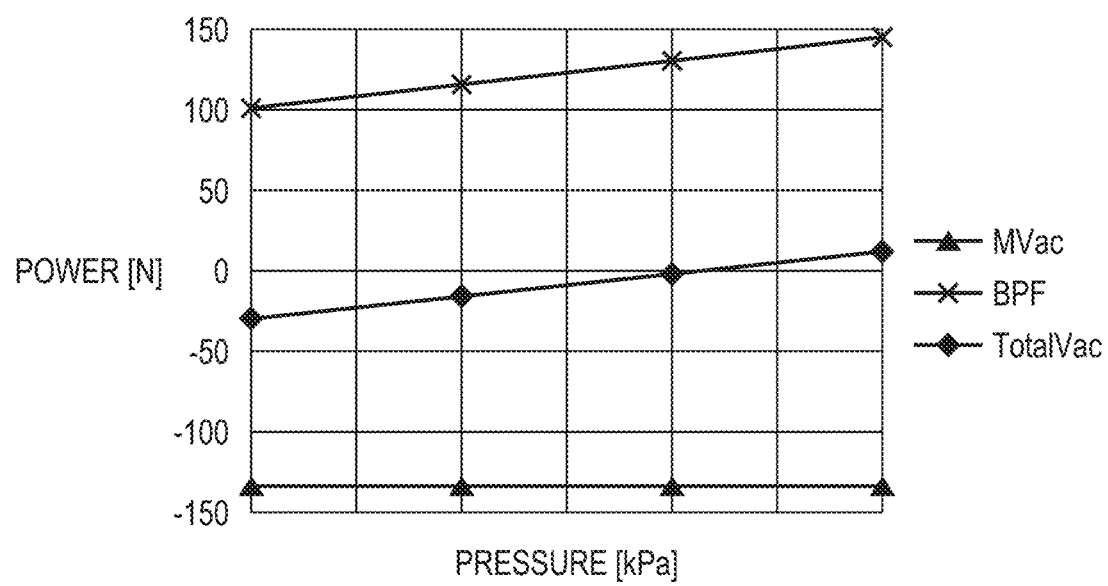
FIG. 9 is a graph showing the results obtained by calculating power to cause a mold to drop from a mold chuck.

FIG. 9 shows the result of calculation under the apparatus conditions shown in Table 1. Referring to FIG. 9, MVac represents the suction power (holding power) with respect to the mold 1 by the mold chuck 9, BPF represents the power to cause the mold 1 to drop (dropping power), and TotalVac represents the power (combined power) obtained by combining the suction power MVac and the dropping power BPF. In this case, the plus sign indicates a direction in which the mold 1 is caused to drop from the mold chuck 9.

Referring to FIG. 9, as the pressure added to the core out 8 of the mold 1 increases, the dropping power (BPF) to cause the mold 1 to drop increases proportionally. The suction power (MVac) with respect to the mold 1 by the mold chuck 9 is not influenced by the pressure added to the core out 8 of the mold 1 and is constant. Therefore, when the combined power (TotalVac) obtained by combining the suction power (MVac) and the dropping power (BPF) increases proportionally to the pressure added to the core out 8 of the mold 1 and exceeds 0, the mold 1 drops from the mold chuck 9. For this reason, it is difficult, from the viewpoint of design, to simply increase the pressure added to the core out 8 of the mold 1.

Figure 10:
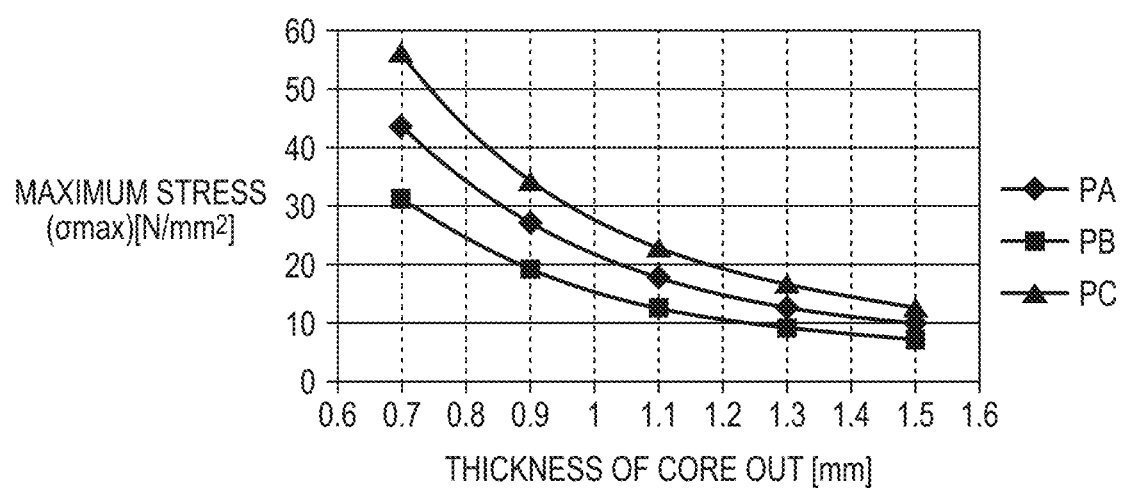
FIG. 10 is a graph showing the results obtained by calculating the relationships between the thickness of the core out of a mold and maximum stress.

The present inventor calculated the relationship between the thickness of the core out 8 of the mold 1 and the maximum stress exerted on the peripheral portion (edge portion) of the core out 8 when a pressure was added to the core out 8 of the mold 1. FIG. 10 shows the result obtained by calculating the relationship between the thickness of the core out 8 of the mold 1 and the maximum stress exerted on the peripheral portion of the core out 8. Referring to FIG. 10, a curve PA represents the relationship when the pressure added to the core out 8 of the mold 1 is set to a reference pressure value. A curve PB represents the relationship when the pressure added to the core out 8 of the mold 1 is set to a pressure value smaller than the reference pressure value, and a curve PC represents the relationship when the pressure added to the core out 8 of the mold 1 is set to a pressure value larger than the reference pressure value.

Referring to FIG. 10, it can be seen that as the thickness of the core out 8 of the mold 1 is smaller than the current value, 1.1 mm, the maximum stress (σmax) exerted on the peripheral portion (edge portion) of the core out 8 increases. In addition, as the pressure added to the core out 8 of the mold 1 increases, the curve (curve PC) rises, that is, the maximum stress increases. As the maximum stress exerted on the peripheral portion of the core out 8 of the mold 1 increases, the risk of breakage of the mold 1 increases. For this reason, it is not easy, from the viewpoint of safety, to simply change the thickness of the core out 8 of the mold 1 and the pressure added to the core out 8 of the mold 1.

As described above, to change the pressure added to the core out 8 of the mold 1, it is necessary to guarantee safety. A specific technique for improving the filling performance of an imprint material in the mold 1 while guaranteeing safety will be described below.

Figure 11:
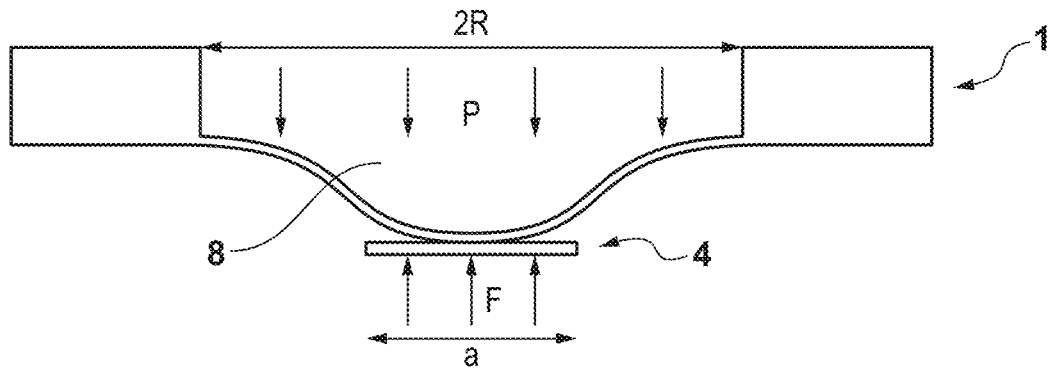
FIG. 11 is a view schematically showing a state in which a mold is in contact with a substrate.

FIG. 11 is a view schematically showing a state in which the mold 1 is in contact with the substrate 4 (the imprint material on the substrate). First of all, a mold-side state, more specifically, a state in which there is no reactive force from the substrate 4 by letting 2R be the diameter of the core out 8 of the mold 1 and P is the pressure value of the pressure added to the core out 8, is calculated. In this case, it is possible to obtain, from equations (1) given below, the maximum stress σmax exerted on the peripheral portion of the core out 8 of the mold 1 and a maximum deformation amount (bending amount) Wmax of the mold 1.

$$\sigma_{max} = \frac{3}{4}\frac{R^2 p}{t^2} \quad (1)$$

$$w_{max} = \frac{1}{64}\frac{R^4 p}{D}$$

$$D = \frac{1}{12}\frac{Et^3}{(1-v^2)}$$

In equations (1), t represents the thickness of the core out 8 of the mold 1, v represents the Poisson ratio of the mold 1, and E represents the longitudinal elastic modulus of the mold 1.

In addition, letting a be the diameter of the contact region between the mold 1 and the substrate 4, the maximum stress σmax and the maximum deformation amount Wmax concerning a state in which the mold 1 is held on the substrate 4 with a power F can be obtained from equations (2):

$$\sigma_{max} = \frac{3p}{2\pi t^2}\left(\frac{a^2}{R^2} - 1\right) \quad (2)$$

$$w_{max} = \frac{p}{16\pi D}\left(R^2 - a^2 - 2a^2 \ln\frac{R}{a}\right)$$

Figure 12:
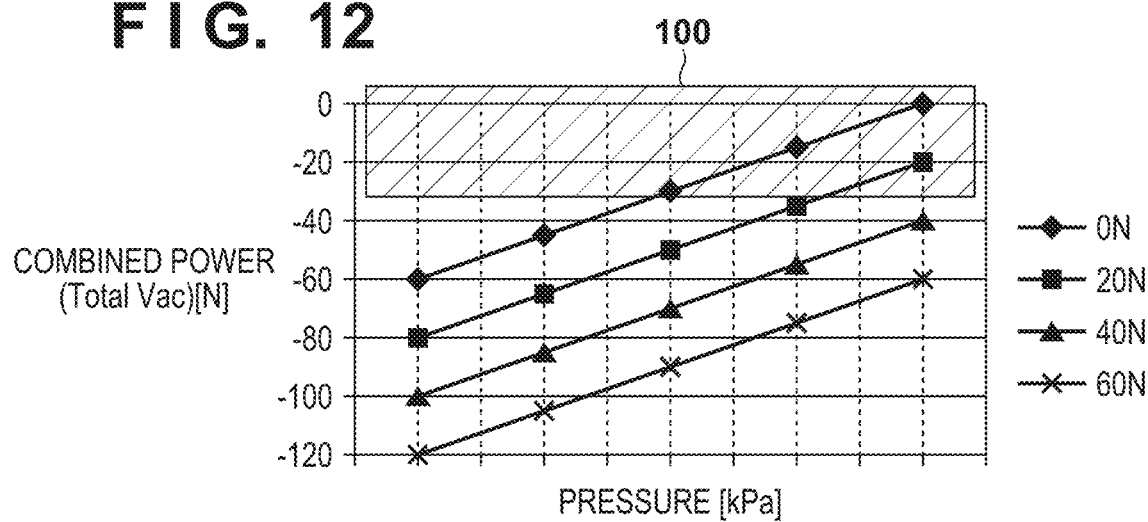
FIG. 12 is a graph showing the relationship between the pressure added to the core out of a mold and the combined power obtained by combining suction power and dropping power.
Figure 13:
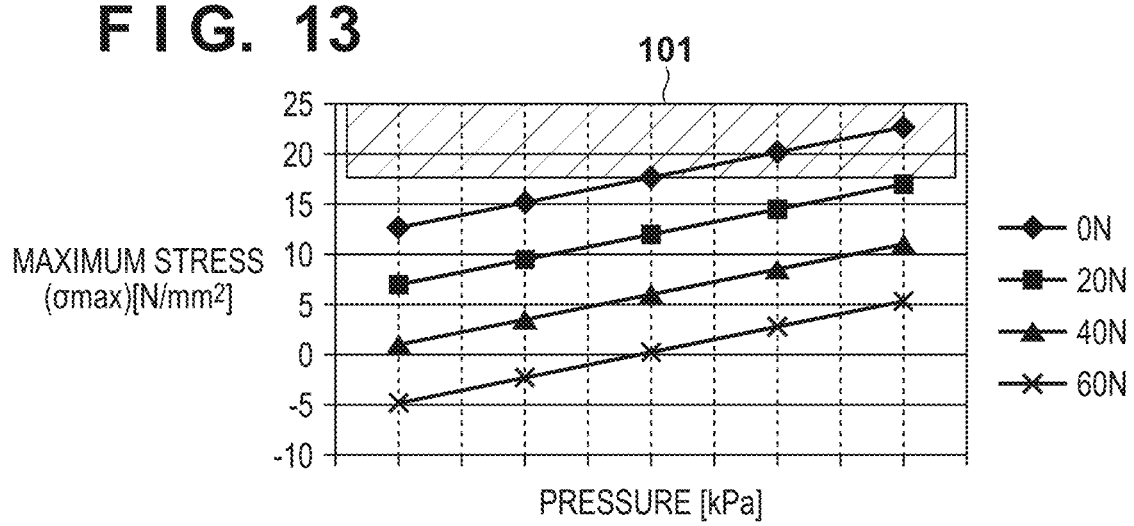
FIG. 13 is a graph showing the relationship between the pressure added to the core out of the mold and the maximum stress.

The final state in which the mold 1 is in contact with the substrate 4 is expressed by a combination of equations (1) and (2). FIGS. 12 and 13 show the results obtained by calculating values while changing the pressure value P of the pressure added to the core out 8 of the mold 1 and the power F at the time of contact between the mold 1 and the substrate 4 and collating the calculated values with design values. Note that the calculation was made by using the standard values of other conditions, for example, the thickness t of the core out 8, the diameter 2R of the core out 8, the diameter a of the contact region, and the coefficient of the material of the mold 1.

FIG. 12 shows the relationship between the pressure added to the core out 8 of the mold 1 and the combined power (TotalVac) obtained by combining the suction power with respect to the mold 1 by the mold chuck 9 and the power to cause the mold 1 to drop and a drop region 100 in which the mold 1 has a chance of dropping from the mold chuck 9. Referring to FIG. 12, it can be said that under the condition that the suction power with which the mold chuck 9 chucks the mold 1 does not fall below −50 N, the mold 1 does not drop from the mold chuck 9, and hence safety is guaranteed.

FIG. 13 shows the relationship between the pressure added to the core out 8 of the mold 1 and the maximum stress (σmax) exerted on the peripheral portion of the core out 8 and a breakage region 101 in which the mold 1 has a chance to break. FIG. 13 indicates that under the condition that the maximum stress does not exceed 18 N/mm² as a design value, the mold 1 does not break, and hence safety is guaranteed.

Consider a control profile for satisfying the condition that safety is guaranteed (the condition set by combining the pressure value P of the pressure added to the core out 8 of the mold 1 and the power F at the time of contact between the mold 1 and the substrate 4) and improving the filling performance of an imprint material in the mold 1. The tilt (to be referred as the "curvature" hereinafter) of the convex shape of the mold 1 in a state in which the mold 1 is in contact with the substrate 4 (the imprint material on the substrate), that is, during contact between them, is smaller than the curvature of the mold 1 in a state in which the mold 1 is not in contact with the substrate 4. Accordingly, it is possible to improve the filling performance of an imprint material at the portion at which the curvature of the mold 1 is the smallest by gradually increasing the curvature of the mold 1 before the portion. The portion at which the curvature of the mold 1 is the smallest is the peripheral portion of the mesa region 2 of the mold 1, especially, a portion near a corner portion, and hence it is preferable to adjust the control profile up to the corner portion of the mesa region 2 within the condition range in which safety is guaranteed.

A basic control profile will be described first with reference to FIG. 14. A pressure control profile 102 is a profile indicating the pressure value of the pressure added to the core out 8 of the mold 1. This profile covers from a dynamic contact step to a static filling step. In the pressure control profile 102, as an initial value, a pressure value is generally set so as to prevent the mold 1 from dropping from the mold chuck 9 and prevent the mold 1 from being broken. In the pressure control profile 102, pressure values that rapidly decrease from the initial value to 0 after the lapse of a predetermined period are set. A power control profile 103 is a profile indicating the value of the pressing power with which the imprint head 6 presses the mold 1 against the imprint material on the substrate. This profile covers from the dynamic contact step to the static filling step. In the power control profile 103, as an initial value, the value of a pressing power is set, which increases the power from the initial state in which the mold 1 comes into contact with the imprint material on the substrate and increases the contact area between the mold 1 and imprint material on the substrate. In the power control profile 103, pressing power values that rapidly decrease from the initial value to 0 after the lapse of a predetermined period are set.

A control profile according to this embodiment will be described next with reference to FIG. 15. A pressure control profile 104 is a profile indicating the pressure value of the pressure added to the core out 8 of the mold 1. This profile covers from a dynamic contact step to a static filling step. In the pressure control profile 104, as an initial value, a pressure value similar to that of the pressure control profile 102 is set. In the pressure control profile 104, pressure values are set, which increase from the initial value while the imprint head 6 adds pressing power to the imprint material on the substrate after the mold 1 comes into contact with the imprint material on the substrate. Note, however, that the pressure values set in the pressure control profile 104 (that is, the pressure values that increase from the initial value) are set within the condition range in which safety is guaranteed, as described above. More specifically, the pressure control profile 104 (the pressure values of pressures to be added to the core out 8 of the mold 1) are set so as to satisfy the relationship represented by inequality (3) given below:

$$\{BP(t)-BP(0)\} \times a + \{IHF(t)-IHF(0)\} \leq 0- \quad (3)$$

In inequality (3), BP(0) represents the initial value of the pressure added to the core out 8 of the mold 1, BP(t) represents the pressure value t sec after the mold 1 comes into contact with the imprint material on the substrate, a represents a power-to-pressure conversion coefficient [N/kpa] of the pressure added to the core out 8 of the mold 1, IHF(0) represents the initial value of the pressing power of the imprint head 6, and IHF(t) represents the pressing power t sec after the mold 1 comes into contact with the imprint material on the substrate. Assume that a direction in which a pressure added to the core out 8 of the mold 1 increases is defined as the plus direction of power, and a direction in which pressing power is added is defined as the minus direction of power.

Inequality (3) indicates that it is possible to form a pressure control profile that starts to increase the pressure to be added to the core out 8 of the mold 1 as long as inequality (3) is satisfied after the mold 1 comes into contact with the imprint material on the substrate after the start of a contact step.

In addition, a power control profile 105 is a profile that indicates the value of the pressing power with which the imprint head 6 presses the mold 1 against the imprint material on the substrate. This profile covers from the dynamic contact step to the static filling step. In the power control profile 105, as an initial value, the value of pressing power is set, which increases the power from the initial state, in which the mold 1 comes into contact with the imprint material on the substrate, so as to increase the contact area between the mold 1 and the imprint material on the substrate. In addition, in the power control profile 105, the values of pressing power, which steeply decrease from the initial value to 0 after the lapse of a predetermined period, are set. Referring to FIG. 15, at each time after the mold 1 comes into contact with the imprint material on the substrate, the pressure (power) added to the core out 8 of the mold 1 is smaller than the pressing power of the imprint head 6.

In the power control profile 105, the values of pressing power larger than those set in the power control profile 103 are set. This is because the power control profile 105 needs to be synchronized (interlocked) with the pressure control profile 104, and the pressing power of the imprint head 6 needs to be increased in synchronism with an increase in the pressure added to the core out 8 of the mold 1.

Figure 16:
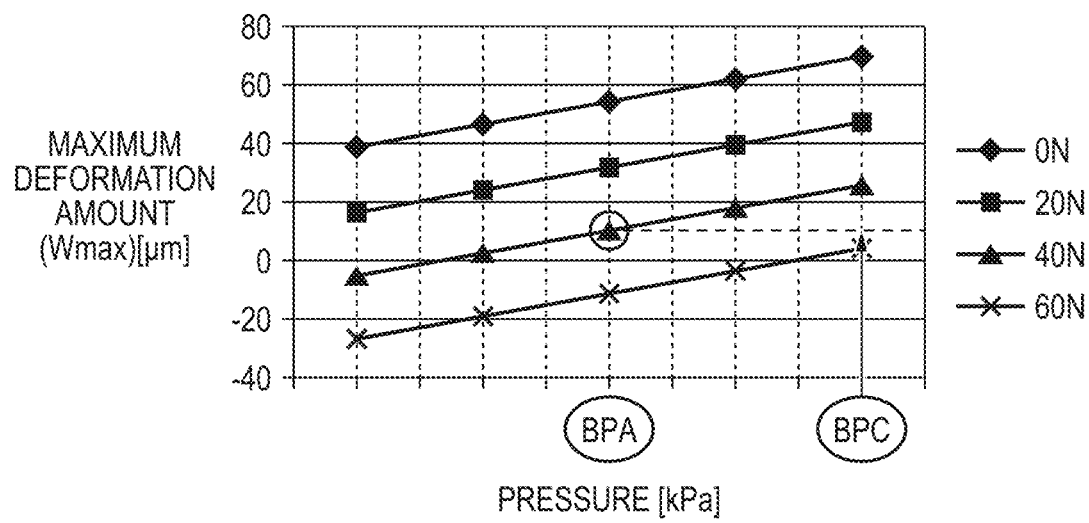
FIG. 16 is a graph showing the relationship between the pressure added to the core out of a mold and the maximum deformation amount of the mold.

FIG. 16 shows the relationship between the pressure added to the core out 8 of the mold 1 and the maximum deformation amount (Wmax) of the mold 1. Referring to FIG. 16, it can be seen that when the pressing power of the imprint head 6 is 40 N, for example, pressing power near 60 N is required to deform the mold 1 by the same deformation amount even when the pressure added to the core out 8 of the mold 1 changes from a pressure value BPA to a pressure value BPC. Therefore, the power control profile 105 needs to be formed so as to synchronize the power control profile 105 with the pressure control profile 104 and keep the speed constant at which the imprint head 6 spreads the imprint material on the substrate.

As described above, in this embodiment, the control unit 18 controls the pressure to be added to the core out 8 of the mold 1 through the pressure adjusting unit 7 in an imprint process, more specifically, a dynamic spread step. More specifically, the power (pressure) applied by the pressure adjusting unit 7 to the core out 8 after contact between the mesa region 2 of the mold 1 and the imprint material is set to be larger than the power applied by the pressure adjusting unit 7 to the core out 8 before the contact between the mesa region 2 and the imprint material. For example, the pressure on the core out 8 which should be adjusted by the pressure adjusting unit 7 is set to a first pressure value (initial value) so as to form the mesa region 2 in a convex shape with respect to the substrate side before contact between the mold 1 and the imprint material. While the mold 1 is brought into contact with and pressed against the imprint material, the pressure on the core out 8 which should be adjusted by the pressure adjusting unit 7 is set to a second pressure value larger than the first pressure value. This makes it possible to implement pressure control shown as the pressure control profile 104 in FIG. 15. Although this embodiment has exemplified the case in which the pressure on the core out 8 which should be adjusted by the pressure adjusting unit 7 is changed from the first pressure value to the second pressure value larger than the first pressure value within a predetermined time after contact between the mold 1 and the imprint material, the present invention is not limited to this. For example, the pressure on the core out 8 which should be adjusted by the pressure adjusting unit 7 may be changed from the first pressure value to the second pressure value large than the first pressure value at the timing when the mold 1 comes into contact with the imprint material.

As described above, in a dynamic spread step, the imprint head 6 and the pressure adjusting unit 7 are controlled so as to synchronize the pressing power with which the imprint head 6 presses the mold 1 against the imprint material with the pressure (power) added by the pressure adjusting unit 7 to the core out 8 of the mold 1. In addition, the imprint head 6 is controlled, based on, for example, information concerning an increase in the contact area obtained by the observation unit 14, so as to keep the speed of spreading the imprint material constant (so as to increase the contact area between the mold 1 and the imprint material at a constant speed). Such control is especially effective when performed in a period in which the pressing power is increased among periods included in a dynamic spread step in which the pressing power is increased and reduced.

The results obtained by performing simulations using control profiles according to this embodiment will be described below. In the simulations, the simulator (Nilus: Nano Imprint Lithography Unified Simulator) developed by the present applicant was used. Such a simulator can calculate the deformation of the mold 1 in accordance with the pressure of a gas (gas pressure) by calculating the pressure of the gas present between the mold 1 and the substrate 4 from the control profiles. This makes it possible to evaluate the curvature of the mold 1 at the contact boundary between the mold 1 and the imprint material on the substrate. In addition, the speed of filling an imprint material (filling speed) can be evaluated by calculating the number of molecules of a gas confined between the mold 1 and the imprint material on the substrate.

First of all, the curvature of a corner portion of the mesa region 2 of the mold 1 was evaluated as the curvature of the mold 1 at the contact boundary. Evaluation conditions included the dimension of the mold 1: 150 mm×150 mm, the dimension of the mesa region 2: 26 mm×33 mm, the height of the mesa region 2: 30 μm, and the pattern formed in the mesa region 2: a pillar pattern with different dimensions of several ten nm. The drop pattern of the imprint material on the substrate was a standard repetitive grid pattern in a staggered arrangement.

Figure 17:
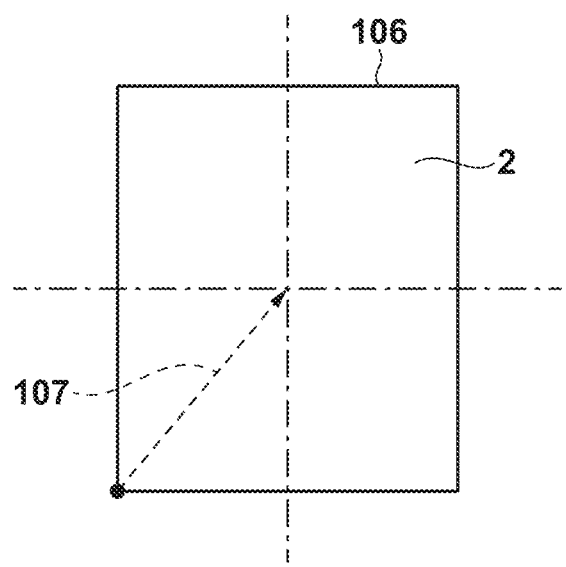
FIG. 17 is a view for explaining an evaluation method of evaluating the curvature of a mold.

A method of evaluating the curvature of the mold 1 will be described with reference to FIG. 17. As shown in FIG. 17, the curvature of the mold 1 was evaluated by plotting a cross-section of an outer shape 106 defining the mesa region 2 of the mold 1 which was taken along an arrow 107 directed from the lower left corner of the mesa region 2 to the center of the mesa region 2.

Figure 14:
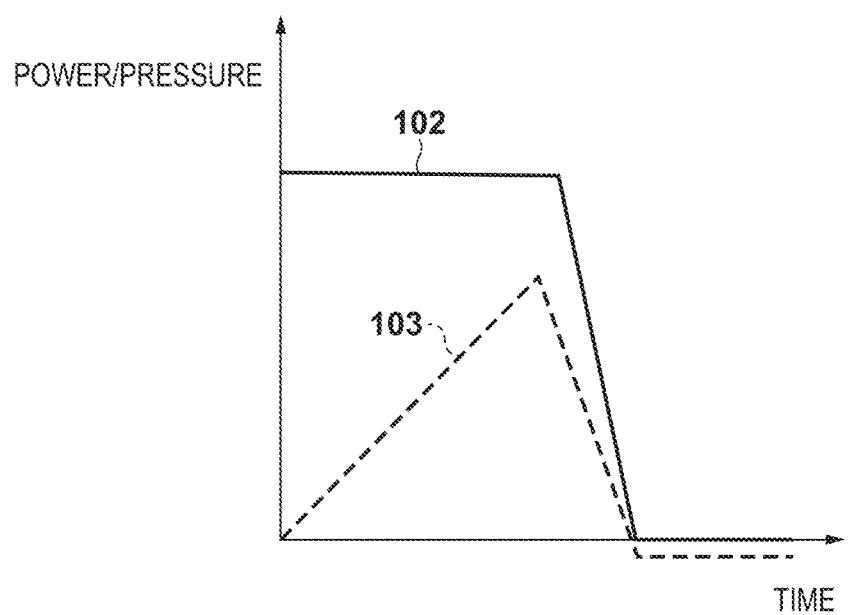
FIG. 14 is a graph for explaining basic control profiles.
Figure 19:
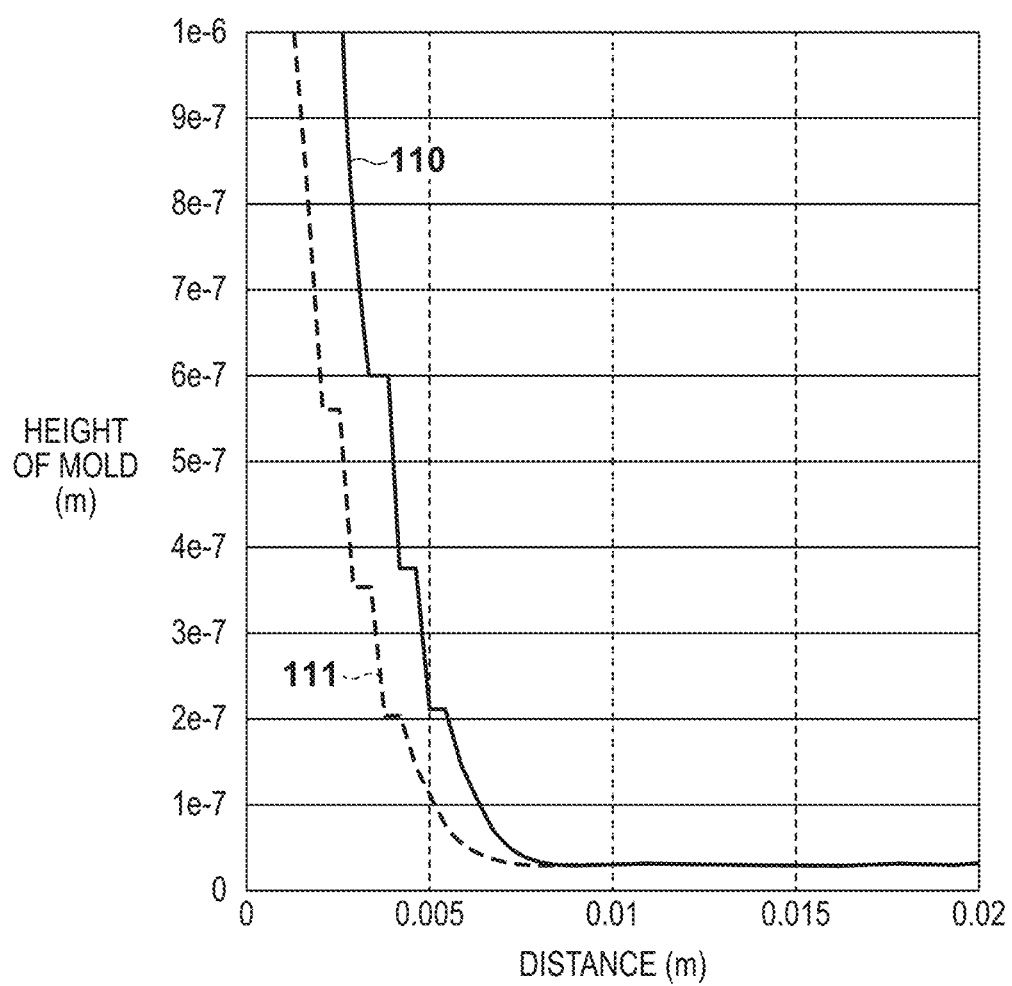
FIG. 19 is a graph showing the result of evaluating the curvature of a mold by using the control profiles according to this embodiment shown in FIG. 15.

FIG. 18 shows the results obtained by evaluating the curvature of the mold 1 by using the basic control profiles shown in FIG. 14. Referring to FIG. 18, plots 108 and 109 indicate the results obtained by evaluating the curvature of the mold 1 by using two different types of control profiles as basic control profiles. FIG. 19 shows the results obtained by evaluating the curvature of the mold 1 by using the control profiles shown in FIG. 15 according to this embodiment. Referring to FIG. 19, plots 110 and 111 indicate the results obtained by evaluating the curvature of the mold 1 by using two different types of control profiles as control profiles according to the embodiment. In evaluating the above four different control profiles, the plots 108 to 111 indicate the curvatures of the mold 1 at the same time (more specifically, 0.2 sec that is the set value of the time required for the dynamic spread step).

The plots 108 and 109 corresponding to the basic control profiles shown in FIG. 14 will be compared with each other. The curvature of the mold 1 at the contact boundary indicated by the plot 108 is higher than the curvature of the mold 1 at the contact boundary indicated by the plot 109. Referring to the plot 108, the distance of the contact boundary from the corner (0 mm) of the mesa region 2 is large, and the corner portion of the mesa region 2 is not pressed against the imprint material on the substrate within the time required for the dynamic spread step. In contrast to this, referring to the plot 109, although it seems that the distance of the contact boundary from the corner of the mesa region 2 is small, the distance is not much different from that indicated by the plot 108, and the curvature of the mold 1 seems to continue near to the corner portion of the mesa region 2 while being very small. Therefore, referring to the plot 109 like the plot 108, the corner portion of the mesa region 2 is not sufficiently pressed against the imprint material on the substrate.

As described above, the basic control profile shown in FIG. 14 indicates that the dynamic spread step (the pressing of the mold 1 against the imprint material on the substrate) cannot be completed within the time of 0.2 sec. In addition, even if the speed of spreading the imprint material on the substrate is increased, since the curvature of the mold 1 significantly reduced, a gas tends to be confined between the mold 1 and the imprint material on the substrate. This makes it difficult to improve the filling performance of the imprint material. The confinement of a gas will be complementally described later with reference to concrete examples.

Figure 15:
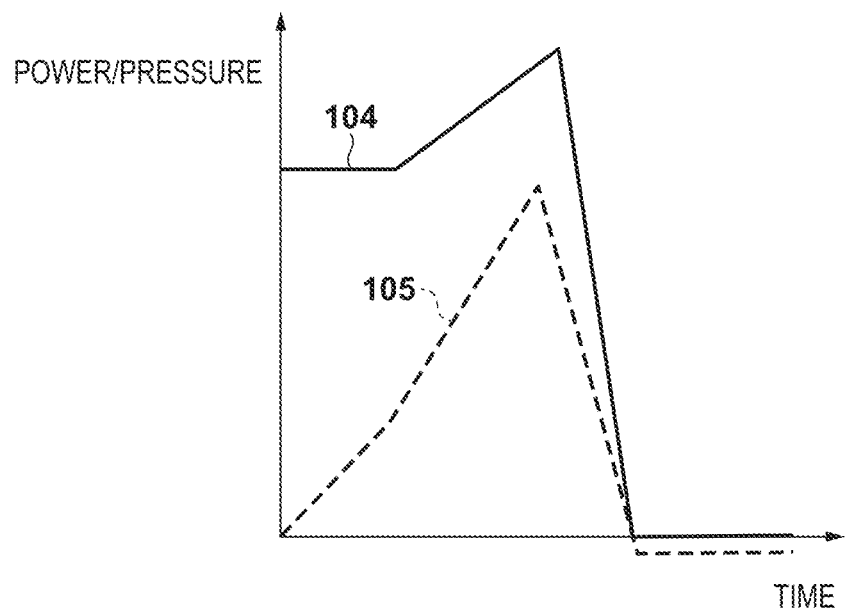
FIG. 15 is a graph for explaining control profiles in this embodiment.

Referring to the plots 110 and 111 corresponding to the control profiles shown in FIG. 15 according to this embodiment, as compared with the plots 108 and 109, the distance of the contact boundary from the corner of the mesa region 2 is small. In addition, the plots 110 and 111 indicate that the curvature of the mold 1 is maintained very high, and the corner portion of the mesa region 2 is sufficiently pressed against the imprint material on the substrate.

As described above, the control profiles according to this embodiment make it possible to maintain the curvature high near the corner portion of the mesa region 2 even if the time required for the dynamic spread step is shortened.

Figure 20:
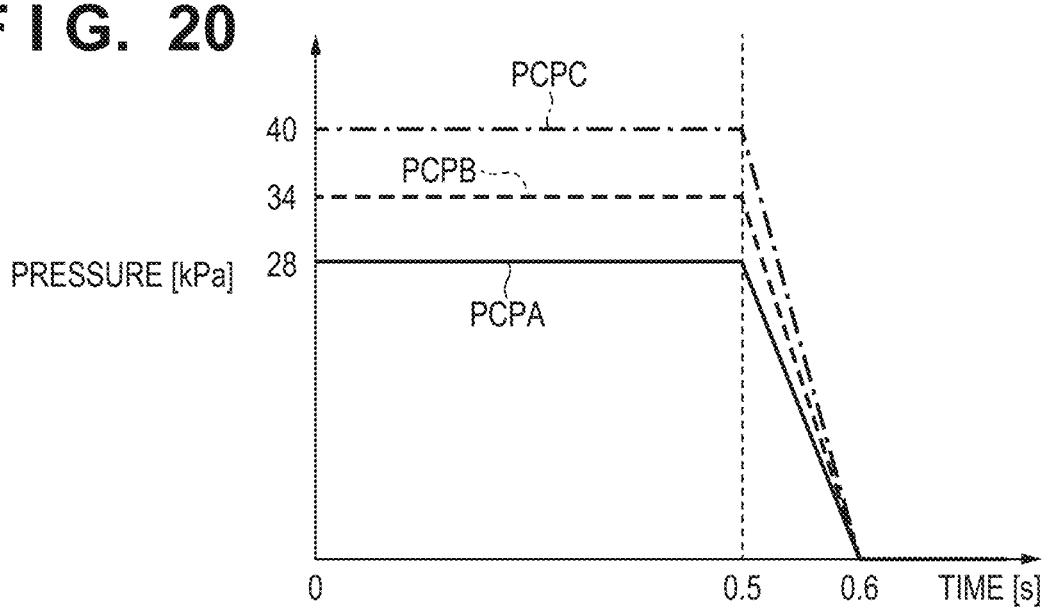
FIG. 20 is a graph showing pressure control profiles.
Figure 21:
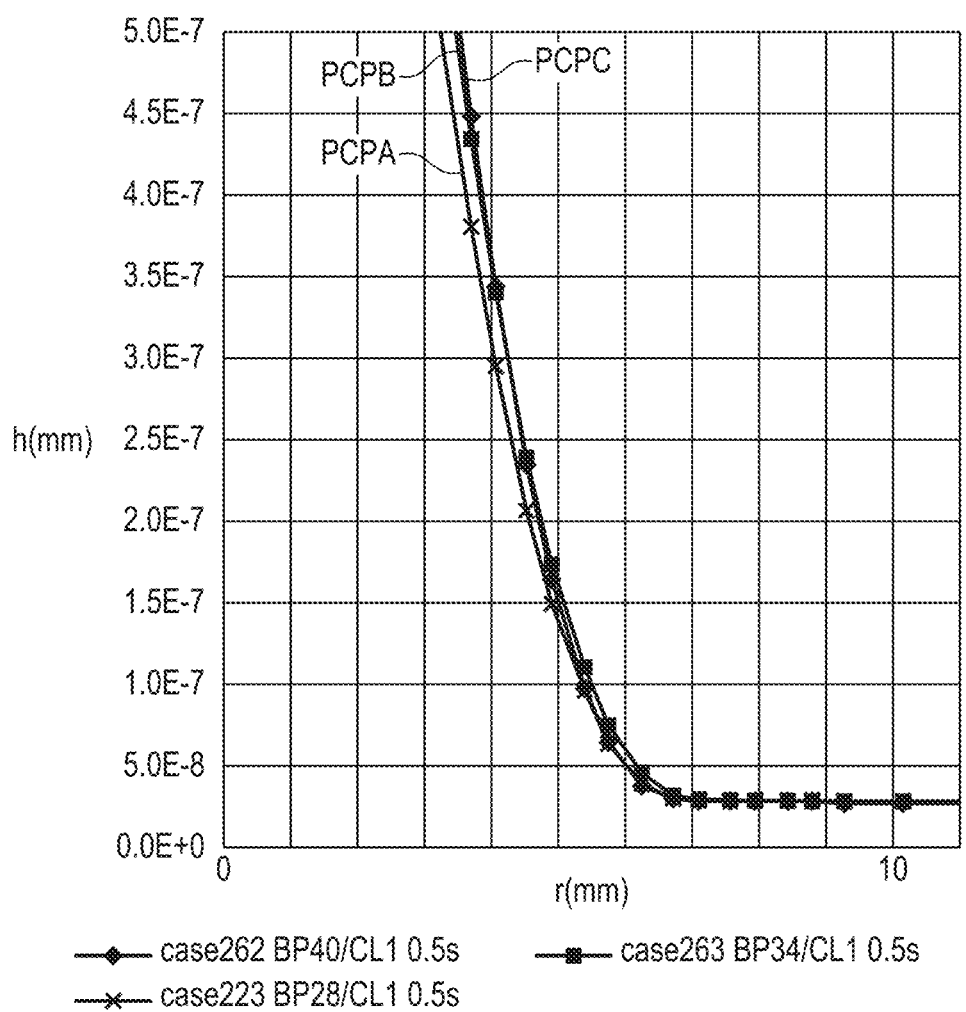
FIG. 21 is a graph showing the results of simulation on the pressure control profiles shown in FIG. 20.

Differences in the curvature of the mold 1 at the contact boundary will be described in detail below. Imprint processes were performed with three types of pressure values added to the core out 8 of the mold 1. The curvature of the mold 1 was calculated and evaluated from a simulation while the distance of the contact boundary from the center of the mesa region 2 remained almost the same. As shown in FIG. 20, the time required for the contact step was set to 0.5 sec, and a pressure control profile PCPA with a pressure value of 28 kPa, a pressure control profile PCPB with a pressure value of 34 kPa, and a pressure control profile PCPC with a pressure value of 40 kPa were created. FIG. 21 shows the results of simulations on the three pressure control profiles PCPA, PCPB, and PCPC shown in FIG. 20. Referring to FIG. 21, it can be seen that the curvature of the mold 1 remains almost the same as long as the pressure added to the core out 8 of the mold 1 is 28 kPa or more.

Figure 22:
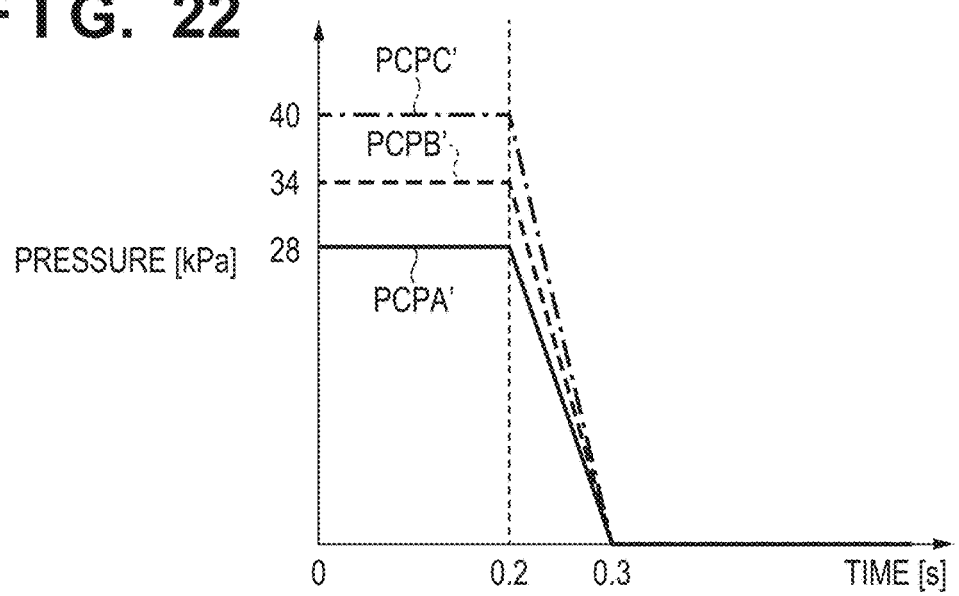
FIG. 22 is a graph showing pressure control profiles.
Figure 23:
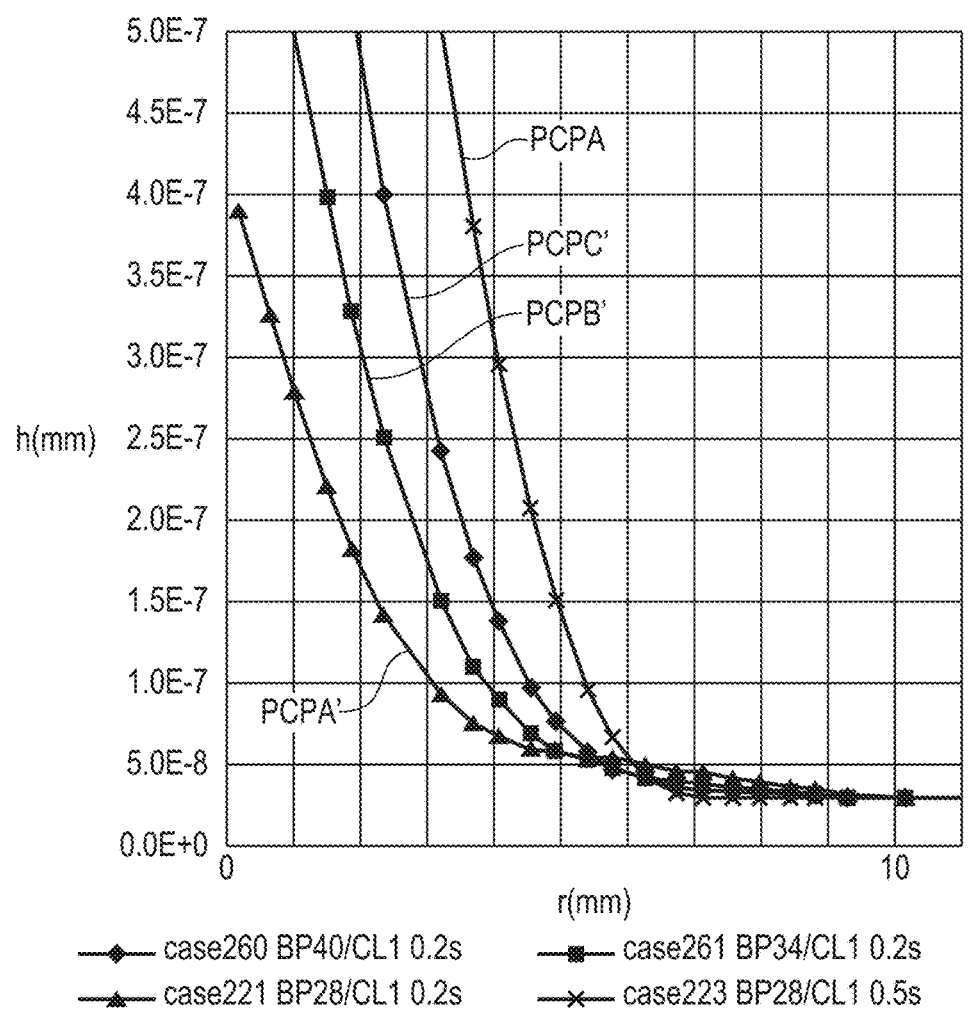
FIG. 23 is a graph showing the results of simulation on the pressure control profiles shown in FIG. 22.

As shown in FIG. 22, the time required for the contact step was set to 0.2 sec, and a pressure control profile PCPA' with a pressure value of 28 kPa, a pressure control profile PCPB' with a pressure value of 34 kPa, and a pressure control profile PCPC' with a pressure value of 40 kPa were created. Imprint processes were performed with the pressure control profiles PCPA', PCPB', and PCPC'. The curvature of the mold 1 was calculated and evaluated from a simulation while the distance of the contact boundary from the center of the mesa region 2 remained almost the same. FIG. 23 shows the results of simulations on the three pressure control profiles PCPA', PCPB', and PCPC' shown in FIG. 22. Referring to FIG. 23, it can be seen that the results greatly differ from those shown in FIG. 21 and that as the pressure added to the core out 8 of the mold 1 increases, the curvature of the mold 1 increases and approaches a result of a simulation on the pressure control profile PCPA.

The curves indicating the curvatures of the mold 1 shown in FIG. 23 will be compared with each other. The pressure control profile PCPA indicates that the height of the mesa region 2 is about 35 nm near 10 mm from the corner portion of the mesa region 2. This height corresponds to the height of the imprint material on the substrate which is determined by the amount and drop count of imprint material. The height of the mesa region 2 sharply increases as the distance to the corner portion of the mesa region 2 decreases to, for example, about 6 mm. In contrast, as the distance becomes near 10 mm, the height of the mesa region 2 gradually increases. As the distance exceeds 6 mm, the height of the mesa region 2 does not greatly change and gradually decreases. This tendency increases in the order of the pressure control profiles PCPC', PCPB', and PCPA'. Accordingly, in qualitative terms, increasing the pressure added to the core out 8 of the mold 1 and the pressing power of the imprint head 6 can make the curvature of the mold 1 when the time required for the contact step is 0.2 sec approach the curvature of the mold 1 when the time required for the contact step is 0.5 sec. In practice, however, an upper limit should be determined by the control specifications in the imprint apparatus IMP.

In general, it is thought that shortening the time required for a contact step will make the curvature of the mold 1 at the contact boundary greatly influence the pressure of a gas between the mold 1 and the imprint material on the substrate. This seems to make it difficult to maintain the curvature of the mold 1 high. However, according to the control profiles according to this embodiment, even if the time required for a contact step is shortened, the curvature of the mold 1 can be maintained high in the same manner as before the time required for the contact step is shortened.

Figure 24:
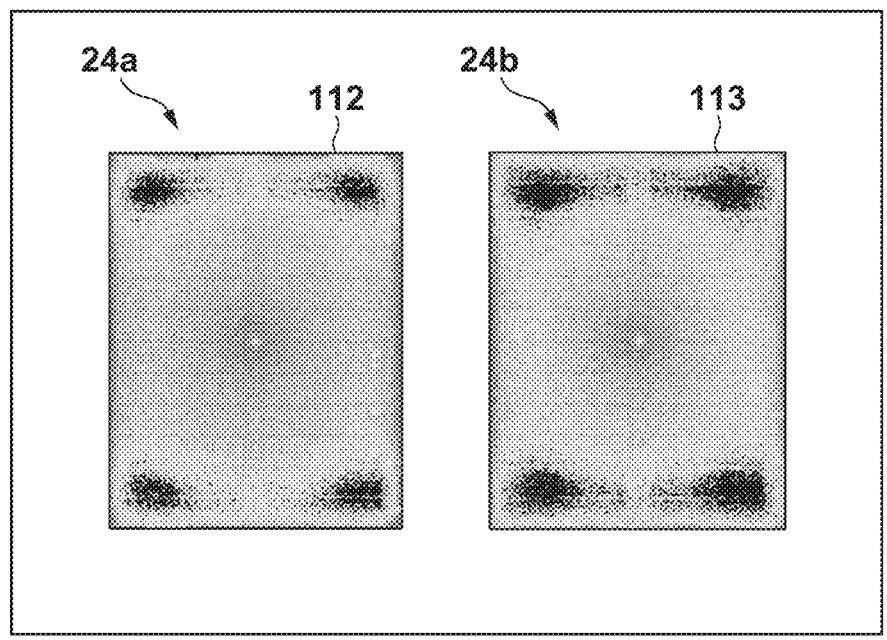
FIG. 24 is a view showing maps indicating the numbers of molecules of gases trapped between a mold and an imprint material on a substrate.

Subsequently, a difference in the number of molecules of the gas trapped between the mold 1 and the imprint material on the substrate was evaluated from a difference in the curvature of the mold 1 in an imprint process. FIGS. 24*a* and 24*b* show maps indicating the numbers of molecules of gases trapped between the mold 1 and the imprint material on the substrate. In FIGS. 24*a* and 24*b*, the black regions indicate a state in which the numbers of molecules of gases are large, and the white regions indicate a state in which the numbers of molecules of gases are small. FIG. 24*a* shows a map 112 corresponding to the plot 108 shown in FIG. 18. FIG. 24*b* shows a map 113 corresponding to the plot 109 shown in FIG. 18.

Referring to FIGS. 24*a* and 24*b*, maps 112 and 113 have distributions similar in terms of the numbers of molecules of gases and it can be seen that the numbers of molecules of gases are large near the corner portion of the mesa region 2. The black regions in the map 113 are wider than those in the map 112. As described above, therefore, since the black regions are wide, this tendency seems to be influenced by the plot 109 in which the curvature of the mold 1 is smaller. In the case of the plot 108 as well in which the curvature of the mold 1 was not so small, since part of the corner portion of the mesa region 2 was not pressed against the imprint material on the substrate, it seems that a large amount of gas was trapped to increase the number of molecules of the gas.

Figure 25:
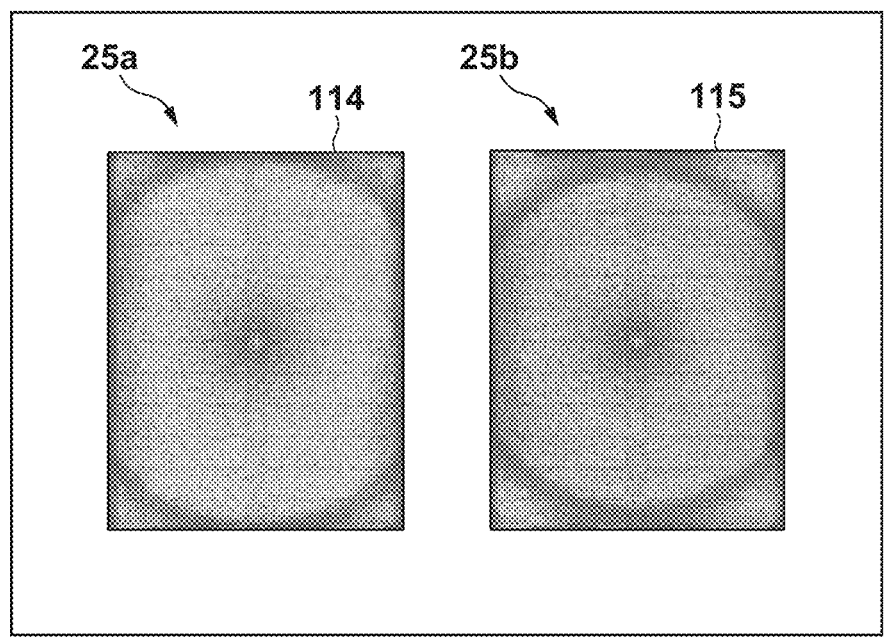
FIG. 25 is a view showing maps indicating the numbers of molecules of gases trapped between a mold and an imprint material on a substrate.

FIGS. 25*a* and 25*b* show maps indicating the numbers of molecules of gases trapped between the mold 1 and the imprint material on the substrate. Referring to FIGS. 25*a* and 25*b*, the black regions indicate that the numbers of molecules of gases are large, and the white regions indicate that the numbers of molecules of gases are small. FIG. 25*a* shows a map 114 corresponding to the plot 110 shown in FIG. 19. FIG. 25*b* shows a map 115 corresponding to the plot 111 shown in FIG. 19.

Referring to FIGS. 25*a* and 25*b*, unlike the maps 112 and 113, the maps 114 and 115 indicate that the black regions near the corner portions of the mesa region 2 disappear, and the numbers of molecules of trapped gases are reduced. However, the maps 114 and 115 include belt-like regions inscribed in the mesa region 2. Such phenomenon can be improved by observing the behaviors of a change in contact distance with time and a change of the height of the mold 1 with time and making the speed of spreading the imprint material on the substrate constant with respect to the resistance to the pressure of a gas. This makes it possible to keep constant the gas trapped between the mold 1 and the imprint material on the substrate and minimize the number of molecules of the trapped gas. In other words, it is preferable to create control profiles (a pressure control profile and a power control profile) which make the speed of spreading an imprint material on a substrate constant. These control profiles can be more effectively improved by being created as control profiles continuous across not only a contact step but also a subsequent step in which the pressure of the core out 8 is reduced. More specifically, the behaviors of a change in contact distance with time and a change in the height of the mold 1 with time can be obtained from a simulation result or an experiment using the imprint apparatus IMP (the result of an imprint process).

As described above, this embodiment can provide the imprint apparatus IMP that can reduce the molecular weight of a gas trapped between the mold 1 and an imprint material on a substrate by maintaining the curvature of the mold 1 high and is advantageous in improving the productivity.

The pattern of a cured product formed using the imprint apparatus IMP is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 26:
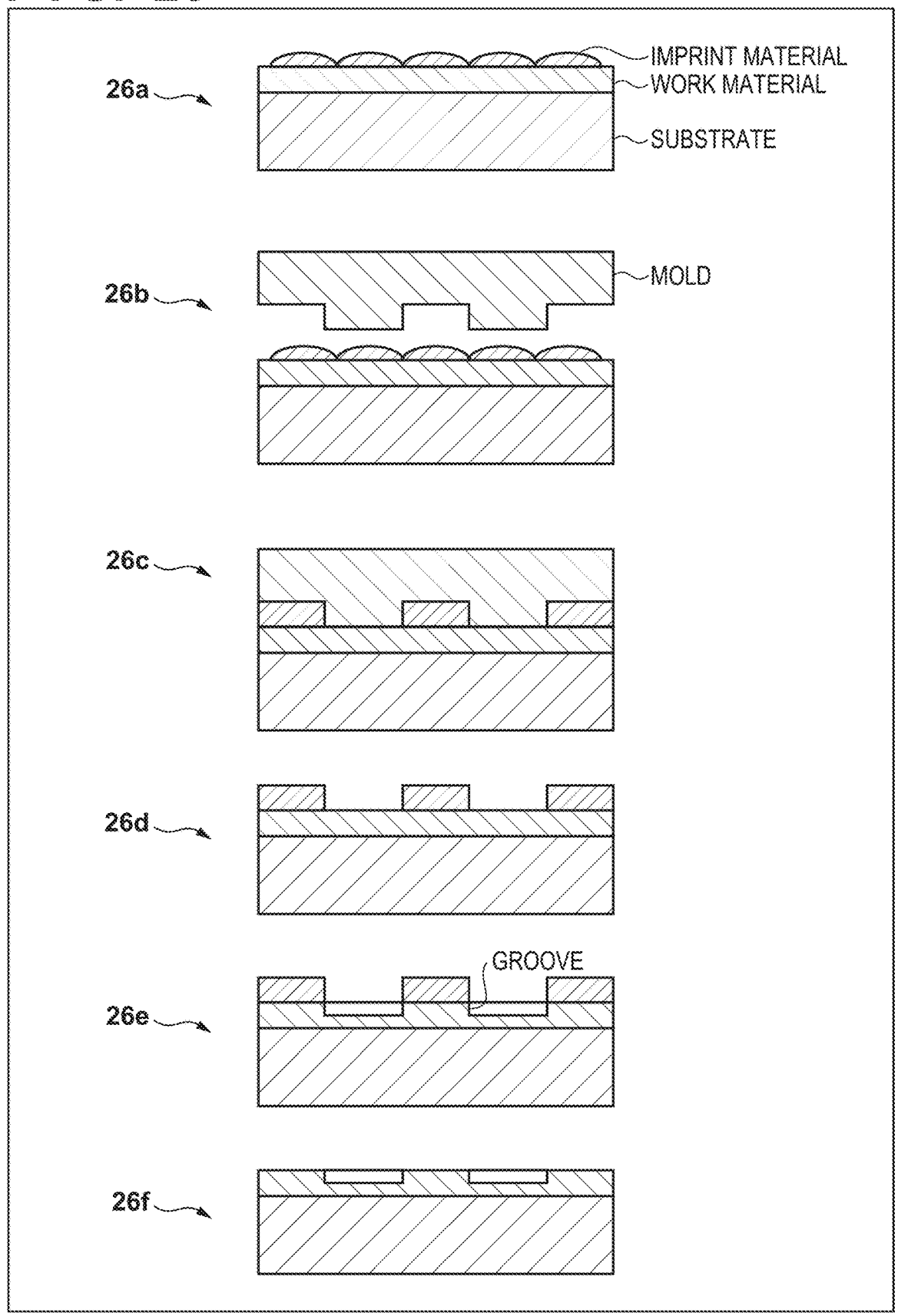
FIG. 26 is a view for explaining an article manufacturing method.

Next, description regarding a detailed method of manufacturing an article is given. As illustrated in FIG. 26*a*, the substrate such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

As shown in FIG. 26*b*, a side of the mold for imprint with a projection and groove pattern is formed on and caused to face the imprint material on the substrate. As illustrated in FIG. 26*c*, the substrate to which the imprint material is applied is brought into contact with the mold, and a pressure is applied. The gap between the mold and the processed material is filled with the imprint material. In this state, when the imprint material is irradiated with light serving as curing energy through the mold, the imprint material is cured.

As shown in FIG. 26*d*, after the imprint material is cured, the mold is released from the substrate. Thus, the pattern of the cured product of the imprint material is formed on the substrate. In the pattern of the cured product, the groove of the mold corresponds to the projection of the cured product, and the projection of the mold corresponds to the groove of the cured product. That is, the projection and groove pattern of the mold is transferred to the imprint material.

As shown in FIG. 11*e*, when etching is performed using the pattern of the cured product as an etching resistant mask, a portion of the surface of the processed material where the cured product does not exist or remains thin is removed to form a groove. As shown in FIG. 11*f*, when the pattern of the cured product is removed, an article with the grooves formed in the surface of the processed material can be obtained. The pattern of the cured material is removed here, but, for example, the pattern may be used as a film for insulation between layers included in a semiconductor element or the like without being removed after processing, in other words as a constituent member of the article.

Note that this embodiment has exemplified, as the mold 1, a mold for transferring a circuit pattern with an uneven pattern. However, the mold 1 may be a flat template which includes a flat portion without an uneven pattern. A flat template (member) is used in a planarizing apparatus (molding apparatus) that performs a planarizing process (molding process) for molding a composition on a substrate to be flat using the flat portion. The planarizing process includes a process of curing a curable composition with light irradiation or heating in a state in which the flat portion of a flat template is in contact with a curable composition supplied on a substrate. In this manner, this embodiment is applicable to a molding apparatus that molds a composition on a substrate using a flat template.

Figure 27:
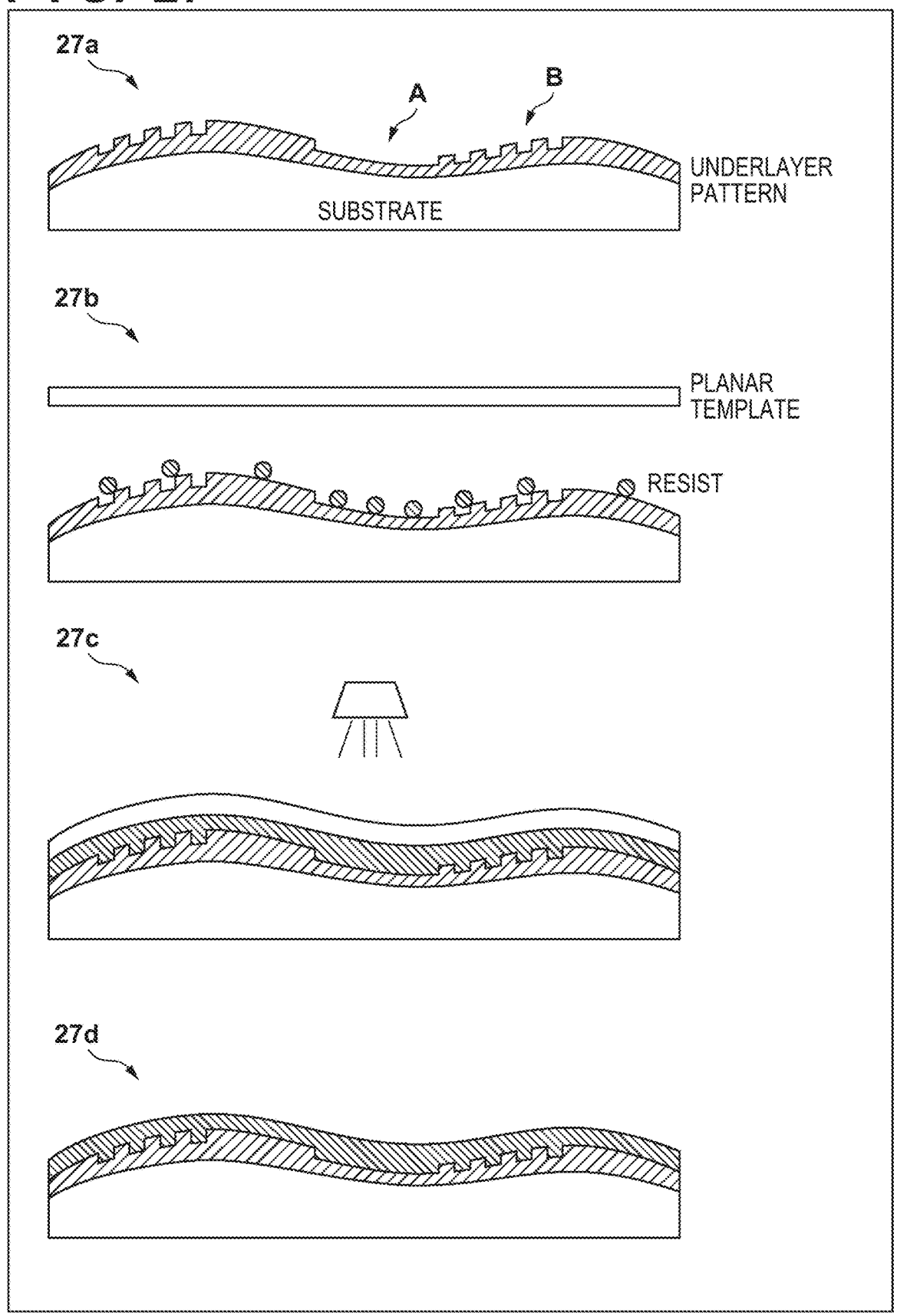
FIG. 27 is a view for explaining a case in which the imprint apparatus shown in FIG. 1 is used as a planarization apparatus.

The underlying pattern on a substrate has a concave/convex profile derived from a pattern formed in the previous step. More particularly, a substrate (process wafer) may have a step of about 100 nm along with a multilayer structure of a recent memory element. The step derived from the moderate undulation of the entire surface of a substrate can be corrected by the focus tracking function of an exposure apparatus (scanner) used in the photolithography process. However, the fine concave/convex portions having a small pitch and falling within the exposure slit area of the exposure apparatus directly consume the DOF (Depth Of Focus) of the exposure apparatus. As a conventional method of planarizing the underlying pattern of the substrate, a technique of forming a planarized layer, such as SOC (Spin On Carbon) or CMP (Chemical Mechanical Polishing) is used. However, in the conventional technique, as shown in FIG. 27a, only the unevenness suppression rate of 40% to 70% can be obtained in the boundary portion between an isolated pattern region A and a repetitive Dense (dense of line and space patterns) pattern region B so sufficient planarization performance cannot be obtained. In addition, the concave/convex difference of the underlying pattern by multilayer formation tends to increase.

As a solution to this problem, U.S. Pat. No. 9,415,418 proposes a technique of forming a continuous film by applying a resist serving as a planarized layer by an inkjet dispenser and imprinting with a flat template. In addition, U.S. Pat. No. 8,394,282 proposes a technique of reflecting the topography measurement result on the substrate side on density information for each position for which application of a resist is instructed by an inkjet dispenser. The imprint apparatus IMP is particularly applicable as a planarization (planarizing) apparatus for locally planarizing the surface of a substrate by pressing a flat template instead of the mold 102 against a pre-applied uncured resist (uncured material).

FIG. 27a shows the substrate before planarization is performed. The area of the convex pattern portion is small in the isolated pattern region A. In the repetitive Dense pattern region B, the area occupied by the convex pattern portion and the area occupied by the concave pattern portion are 1:1. The average heights of the isolated pattern region A and the repetitive Dense pattern region B have different values depending on the ratio occupied by the convex pattern portions.

FIG. 27b shows a state in which a resist for forming a planarized layer is applied to the substrate. FIG. 27b shows a state in which a resist is applied by an inkjet dispenser based on the technique proposed in U.S. Pat. No. 9,415,418. However, a spin coater may be used for applying the resist. In other words, the imprint apparatus IMP can be applied as long as it includes a step of planarizing a pre-applied uncured resist by pressing a flat template against it.

As shown in FIG. 27c, the flat template is made of glass or quartz that transmits ultraviolet light, and the resist is cured by irradiation with ultraviolet light from a light source. The flat template conforms to the profile of the substrate surface for gentle unevenness of the entire substrate. After the resist is cured, as shown in FIG. 27d, the flat template is released from the resist.

The present invention can provide, for example, a molding apparatus advantageous in improving the productivity.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A molding apparatus that molds a composition on a substrate by using a mold, the molding apparatus comprising:
a control unit configured to control a process of forming a film of the composition between a first surface of the mold and the substrate by bringing the first surface into contact with the composition; and
a deforming unit configured to deform the first surface into a convex shape, with respect to a substrate side of the mold, by applying pressure to a second surface of the mold on an opposite side of the mold to the first surface of the mold,
wherein the control unit is configured to control the deforming unit in the process so as to make pressure applied to the second surface of the mold by the deforming unit after contact between the first surface of the mold and the composition larger than a pressure applied to the second surface of the mold by the deforming unit before the contact between the first surface and the composition,
wherein the deforming unit is configured to deform the first surface of the mold into the convex shape, with respect to the substrate side of the mold, by applying the pressure to the second surface upon adjusting a pressure of a core out provided in the second surface of the mold,
wherein the control unit is configured to set the pressure of the core out by the deforming unit to a first pressure value so as to form the first surface of the mold into the convex shape, with respect to the substrate side of the mold, before the contact between the first surface and the composition and is configured to set the pressure of the core out to a second pressure value larger than the first pressure value while the first surface is pressed against the composition, and
wherein the control unit is configured to set the pressure of the core out so as to change the first pressure value to the second pressure value within a predetermined time after contact between the first surface of the mold and the composition while the first surface causes the composition to spread on the substrate.

2. The molding apparatus according to claim 1, further comprising a pressing portion configured to cause the first surface to come in contact with the composition and press the first surface against the composition,
wherein the control unit is configured to control the pressing portion and the deforming unit in the process so as to synchronize pressing power with which the pressing portion presses the first surface against the composition with pressure applied to the second surface by the deforming unit.

3. The molding apparatus according to claim 2, wherein the process includes a period in which the pressing power is increased and a period in which the pressing power is reduced.

4. The molding apparatus according to claim 3, wherein the control unit is configured to control the pressing portion so as to increase a contact area between the first surface and the composition at a constant speed in the period in which the pressing power is increased.

5. The molding apparatus according to claim 4, further comprising an obtaining unit configured to obtain information concerning an increase in contact area between the first surface and the composition,
wherein the control unit is configured to control the pressing portion based on the information so as to increase the contact area at the constant speed.

6. The molding apparatus according to claim 5, wherein the obtaining unit is configured to obtain the information from a result of a simulation of the process or a result of the process.

7. The molding apparatus according to claim 2, wherein the control unit is configured to control the deforming unit so as to make the pressure applied to the second surface by the deforming unit smaller than the pressing power with which the pressing portion presses the first surface against the composition at a time after the first surface comes into contact with the composition.

8. The molding apparatus according to claim 1, wherein the first surface includes a pattern, and
the molding apparatus is configured to form a pattern of the composition on the substrate by bringing the pattern of the first surface into contact with the composition.

9. The molding apparatus according to claim 1, wherein the first surface includes a flat surface portion, and
the molding apparatus is configured to planarize the composition on the substrate by bringing the flat surface portion of the first surface into contact with the composition.

10. An article manufacturing method comprising:
forming a pattern on a substrate by using a molding apparatus defined in claim 8;
processing the substrate on which the pattern is formed; and
manufacturing an article from the processed substrate.

* * * * *